United States Patent
Yuan et al.

(10) Patent No.: US 11,877,482 B2
(45) Date of Patent: Jan. 16, 2024

(54) DISPLAY SUBSTRATE AND METHOD FOR MANUFACTURING THE SAME, DRIVING METHOD AND DISPLAY DEVICE

(71) Applicants: HEFEI BOE JOINT TECHNOLOGY CO., LTD., Anhui (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 819 days.

(21) Appl. No.: 16/971,550

(22) PCT Filed: Oct. 29, 2019

(86) PCT No.: PCT/CN2019/113989
§ 371 (c)(1),
(2) Date: Aug. 20, 2020

(87) PCT Pub. No.: WO2021/081753
PCT Pub. Date: May 6, 2021

(65) Prior Publication Data
US 2023/0095733 A1    Mar. 30, 2023

(51) Int. Cl.
*G09G 3/3208*    (2016.01)
*H10K 59/131*    (2023.01)
(Continued)

(52) U.S. Cl.
CPC ......... *H10K 59/131* (2023.02); *G09G 3/3208* (2013.01); *H10K 71/00* (2023.02);
(Continued)

(58) Field of Classification Search
CPC .. H10K 59/131; H10K 71/00; H10K 59/1201; H10K 59/126; G09G 3/3208;
(Continued)

(56) References Cited

U.S. PATENT DOCUMENTS 11,107,414 B2 *   8/2021   Feng .................... G09G 3/3233
11,227,550 B2 *   1/2022   Feng .................... G09G 3/3266
(Continued)

FOREIGN PATENT DOCUMENTS

CN    104157678 A    11/2014
CN    106960658 A    7/2017
(Continued)

*Primary Examiner* — Jeff Piziali
(74) *Attorney, Agent, or Firm* — BROOKS KUSHMAN P.C.

(57) ABSTRACT

The present disclosure provides a display substrate, a method for manufacturing the same, a driving method and a display device. The display substrate includes a base substrate, gate lines, data lines and sub-pixels. The sub-pixels include sub-pixel columns corresponding to the data lines in a one-to-one manner. In a sub-pixel driving circuit of the sub-pixel, a driving transistor and a data writing transistor are located at a first side of an aperture area of the sub-pixel; a sensing transistor is located at a second side of the aperture area of the sub-pixel. The first side and the second side are opposite sides of the aperture area along the extension direction of the data lines. Gate electrodes of sensing transistors in a same sub-pixel row, and gate electrodes of data writing transistors in an adjacent next sub-pixel row, are all coupled to a gate line corresponding to the adjacent next sub-pixel row. There is a first overlapping area between an orthographic projection of a first electrode plate of the storage capacitor to the base substrate and an orthographic projection of a second electrode plate of the storage capacitor to the base substrate; an orthographic projection of the first overlapping area to the base substrate at least partially (Continued)

overlaps an orthographic projection of the corresponding aperture area of the sub-pixel.

20 Claims, 8 Drawing Sheets

(51) Int. Cl.
*H10K 71/00* (2023.01)
*H10K 59/12* (2023.01)

(52) U.S. Cl.
CPC .............. *G09G 2300/0408* (2013.01); *G09G 2300/0426* (2013.01); *G09G 2300/0452* (2013.01); *G09G 2300/0465* (2013.01); *G09G 2300/0819* (2013.01); *G09G 2300/0842* (2013.01); *G09G 2310/0205* (2013.01); *G09G 2310/08* (2013.01); *G09G 2330/021* (2013.01); *H10K 59/1201* (2023.02)

(58) Field of Classification Search
CPC ... G09G 2300/0408; G09G 2300/0426; G09G 2300/0452; G09G 2300/0465; G09G 2300/0819; G09G 2300/0842; G09G 2310/0205; G09G 2310/08; G09G 2330/021; G09G 3/3233
See application file for complete search history.

(56) References Cited

U.S. PATENT DOCUMENTS

| | | | |
|---|---|---|---|
| 11,568,820 B2* | 1/2023 | Feng | .................... G11C 19/287 |
| 2016/0189628 A1* | 6/2016 | Choi | .................... G09G 3/3233 |
| | | | 345/77 |
| 2016/0189629 A1* | 6/2016 | Jin | ....................... G09G 3/3233 |
| | | | 345/76 |
| 2016/0247869 A1 | 8/2016 | Li et al. | |
| 2017/0162112 A1 | 6/2017 | Ha | |

FOREIGN PATENT DOCUMENTS

| | | |
|---|---|---|
| CN | 109285858 A | 1/2019 |
| CN | 109449188 A | 3/2019 |

* cited by examiner

DISPLAY SUBSTRATE AND METHOD FOR MANUFACTURING THE SAME, DRIVING METHOD AND DISPLAY DEVICE

CROSS-REFERENCE TO RELATED APPLICATION

This application is the U.S. national phase of PCT Application No. PCT/CN2019/113989 flied on Oct. 29, 2019, which is incorporated herein by reference in its entirety.

TECHNICAL FIELD

The present disclosure relates to the field of display technologies, and in particular to a display substrate, a method for manufacturing the same, a driving method and a display device.

BACKGROUND

Active-matrix organic light-emitting diode (hereinafter abbreviated as AMOLED) display devices have attracted widespread attention due to their advantages of low power consumption, wide color gamut and large size. There are many layout modes for this kind of display device, for example, it may be laid out as a bottom emission structure, which realizes light emission from one side where a substrate is located in the display device. The display device with this structure may specifically include a driving circuit film layer, a light emitting unit and a color resist unit. The driving circuit film layer is used to provide a driving signal for the light-emitting unit to enable the light-emitting unit to emit light. The light emitted from the light-emitting unit passes through the color resist unit, thereby realizing the display function of the AMOLED display device.

SUMMARY

An object of the present disclosure is to provide a display substrate, a method for manufacturing the same, a driving method and a display device.

According to a first aspect of the present disclosure, a display substrate is provided and includes:

a base substrate;
a plurality of gate lines on the base substrate;
a plurality of data lines on the base substrate; and
a plurality of sub-pixels on the base substrate;
wherein the plurality of gate lines and the plurality of data lines are arranged to cross each other;
the plurality of sub-pixels include a plurality of sub-pixel columns that are corresponding to the plurality of data lines in a one-to-one manner; each of the plurality of sub-pixel columns includes a plurality of the sub-pixels arranged along an extension direction of the plurality of data lines;
the plurality of sub-pixels further include a plurality of sub-pixel rows that are corresponding to the plurality of gate lines in a one-to-one manner; each of the plurality of sub-pixel rows includes a plurality of the sub-pixels arranged along an extension direction of the plurality of gate lines;
each of the plurality of sub-pixels includes a sub-pixel driving circuit; the sub-pixel driving circuit includes a driving transistor, a data writing transistor and a sensing transistor; the driving transistor and the data writing transistor are located at a first side of an aperture area of the each of the plurality of sub-pixels; the sensing transistor is located at a second side of the aperture area of the each of the plurality of sub-pixels; the first side and the second side are opposite sides of the aperture area along the extension direction of the plurality of data lines;
a second electrode of the data writing transistor is coupled to a corresponding data line of the plurality of data lines; gate electrodes of sensing transistors in a same sub-pixel row of the plurality of sub-pixel rows, and gate electrodes of data writing transistors in an adjacent next sub-pixel row of the plurality of sub-pixel rows, are all coupled to a gate line of the plurality of gate lines corresponding to the adjacent next sub-pixel row;
the sub-pixel driving circuit further includes a storage capacitor coupled between a gate electrode of the driving transistor and a first electrode of the driving transistor; the storage capacitor includes a first electrode plate and a second electrode plate which are disposed oppositely; there is a first overlapping area between an orthographic projection of the first electrode plate to the base substrate and an orthographic projection of the second electrode plate to the base substrate; an orthographic projection of the first overlapping area to the base substrate at least partially overlaps an orthographic projection of the corresponding aperture area of the each of the plurality of sub-pixels.

Optionally, a first electrode of the data writing transistor is located at a third side of a gate line of the plurality of gate lines corresponding to the sub-pixel row where the data writing transistor is located; the second electrode of the data writing transistor is located at a fourth side of the gate line of the plurality of gate lines corresponding to the sub-pixel row where the data writing transistor is located; the third side and the fourth side are opposite along the extension direction of the plurality of data lines; an orthographic projection of a channel portion of the data writing transistor to the base substrate is located within an orthographic projection of the gate line of the plurality of gate lines corresponding to the sub-pixel row where the data writing transistor is located, to the base substrate;

a first electrode of the sensing transistor is located at a third side of a gate line of the plurality of gate lines corresponding to a next sub-pixel row adjacent the sensing transistor;
a second electrode of the sensing transistor is located at a fourth side of the gate line of the plurality of gate lines corresponding to the next sub-pixel row adjacent the sensing transistor; an orthographic projection of a channel portion of the sensing transistor to the base substrate is located with an orthographic projection of the gate line of the plurality of gate lines corresponding to the next sub-pixel row adjacent the sensing transistor to the base substrate;
each of the plurality of gate lines is simultaneously reused as the gate electrodes of various data writing transistors in the corresponding sub-pixel row, and the gate electrodes of the sensing transistors in a preceding sub-pixel row adjacent the corresponding sub-pixel row.

Optionally, the first electrode plate of the storage capacitor includes a first transparent electrode plate, and the second electrode plate of the storage capacitor includes a second transparent electrode plate;
the sub-pixel driving circuit further includes a first conductive connection portion;
a first end of the first conductive connection portion is coupled to the first electrode of the driving transistor; a second end of the first conductive connection portion is coupled to the second electrode of the sensing transistor;

the first conductive connection portion is reused as the second transparent electrode plate.

Optionally, the display substrate further includes a buffer layer disposed on a surface of the base substrate; the first transparent electrode plate of the storage capacitor is located between the buffer layer and the base substrate; the second transparent electrode plate of the storage capacitor is located on a surface of the buffer layer facing away from the base substrate.

Optionally, there is a fifth overlapping area between the orthographic projection of the first overlapping area to the base substrate and the orthographic projection of the corresponding aperture area of the each of the plurality of sub-pixels; an area of the fifth overlapping area is ¼ to ¾ of an area of the corresponding aperture area of the each of the plurality of sub-pixels.

Optionally, the first conductive connection portion, the first electrode of the driving transistor and the second electrode of the sensing transistor are arranged in a same layer, and are all made of transparent oxide conductive material.

Optionally, the sub-pixel driving circuit further includes a second conductive connection portion; the second conductive connection portion is coupled to the first electrode of the data writing transistor, the first transparent electrode plate and the gate electrode of the driving transistor, respectively.

Optionally, there is a second overlapping area between an orthographic projection of the second conductive connection portion to the base substrate and an orthographic projection of the gate electrode of the driving transistor to the base substrate; the second conductive connection portion is coupled to the gate electrode of the driving transistor through a first via hole in the second overlapping area;

there is a third overlapping area between the orthographic projection of the second conductive connection portion to the base substrate and an orthographic projection of the first electrode of the data writing transistor to the base substrate; the second conductive connection portion is coupled to the first electrode of the data writing transistor through a second via hole in the third overlapping area;

there is a fourth overlapping area between the orthographic projection of the second conductive connection portion to the base substrate and an orthographic projection of the first transparent electrode plate to the base substrate; the second conductive connection portion is coupled to the first transparent electrode plate through a third via hole in the fourth overlapping area.

Optionally, the sub-pixel driving circuit further includes:
a third conductive connection portion;

there is a sixth overlapping area between an orthographic projection of the third conductive connection portion to the base substrate and an orthographic projection of the first conductive connection portion to the base substrate; the third conductive connection portion is coupled to the first conductive connection portion through a fourth via hole in the sixth overlapping area;

each of the plurality of sub-pixels further includes a light-emitting unit disposed at one side of the sub-pixel driving circuit away from the base substrate; the light-emitting unit includes an anode, a light-emitting layer and a cathode, which are sequentially stacked in a direction away from the base substrate;

there is a seventh overlapping area between an orthographic projection of the anode to the base substrate and an orthographic projection of the third conductive connection portion to the base substrate; the anode is coupled to the third conductive connection portion through a fifth via hole in the seventh overlapping area.

Optionally, the orthographic projection of the anode to the base substrate overlaps an orthographic projection of the second transparent electrode plate of the storage capacitor to the base substrate.

Optionally, the display substrate further includes a light-shielding layer disposed on a surface of the base substrate; an orthographic projection of the light-shielding layer to the base substrate covers an orthographic projection of all driving transistors to the base substrate.

Optionally, the first electrode plate and the light-shielding layer are arranged in a same layer.

Optionally, there is an eighth overlapping area between the orthographic projection of the light-shielding layer to the base substrate and an orthographic projection of the first electrode of the driving transistor to the base substrate; the light-shielding layer is coupled to the first electrode of the driving transistor through a sixth via hole in the eighth overlapping area.

Optionally, the display substrate further includes:
color resist patterns corresponding to the plurality of sub-pixels in a one-to-one manner, wherein each of the color resist patterns is located between the corresponding sub-pixel driving circuit and the light-emitting unit, and an orthographic projection of each of the color resist patterns to the base substrate overlaps an orthographic projection of the aperture area of the corresponding sub-pixel to the base substrate;

a plurality of sensing signal lines and a plurality of power signal lines; wherein the plurality of sensing signal lines and the plurality of power signal lines all extend in the same direction as the extension direction of the plurality of data lines;

wherein between one of the plurality of power signal lines and one of the plurality of sensing signal lines adjacent the one of the plurality of power signal lines, there are two of the plurality of sub-pixel columns;

two of the plurality of data lines, which are corresponding to the two of the plurality of sub-pixel columns, are located between the two of the plurality of sub-pixel columns; the two of the plurality of sub-pixel columns are corresponding to the one of the plurality of power signal lines;

the plurality of sub-pixels define a plurality of pixel units; each of the plurality of pixel units includes at least three adjacent sub-pixels located in a same sub-pixel row, and colors of the color resist patterns corresponding to the at least three sub-pixels are different; the plurality of pixel units includes a plurality of pixel unit columns, each pixel unit column includes a plurality of the pixel units arranged along the extension direction of the plurality of data lines, and the plurality of pixel unit columns have a one-to-one correspondence with the plurality of sensing signal lines;

in the sub-pixel driving circuit included in each of the plurality of sub-pixels, the gate electrode of the driving transistor is coupled to the first electrode of the data writing transistor; the second electrode of the driving transistor is coupled to the corresponding power signal line; the second electrode of the sensing transistor is coupled to the corresponding sensing signal line.

Optionally, the display substrate further includes fourth conductive connection portions corresponding to the plurality of power signal lines in a one-to-one manner;
  there is a ninth overlapping area between an orthographic projection of each of the fourth conductive connection portions to the base substrate and an orthographic projection of the corresponding power signal line to the base substrate; the fourth conductive connection portion is coupled to the corresponding power signal line through at least one seventh via hole in the ninth overlapping area.

Optionally, the fourth conductive connection portion and the gate electrode of the driving transistor are in the same layer and made of the same material.

Optionally, the color resist patterns corresponding to the at least three sub-pixels included in each of the plurality of pixel units include: a red color resist pattern, a white color resist pattern, a blue color resist pattern, and a green color resist pattern.

Based on the above technical solution of the display substrate, according to a second aspect of the present disclosure, a display device is provided and includes the above display substrate.

Based on the above technical solution of the display substrate, according to a third aspect of the present disclosure, a method for manufacturing a display substrate is provided and includes:
  forming a plurality of gate lines, a plurality of data lines and a plurality of sub-pixels on a base substrate; wherein the plurality of gate lines and the plurality of data lines are arranged to cross each other;
  wherein the plurality of sub-pixels include a plurality of sub-pixel columns that are corresponding to the plurality of data lines in a one-to-one manner, each of the plurality of sub-pixel columns includes a plurality of the sub-pixels arranged along an extension direction of the plurality of data lines;
  the plurality of sub-pixels include a plurality of sub-pixel rows that are corresponding to the plurality of gate lines in a one-to-one manner, each of the plurality of sub-pixel rows includes a plurality of the sub-pixels arranged along an extension direction of the plurality of gate lines;
  each of the plurality of sub-pixels includes a sub-pixel driving circuit; the sub-pixel driving circuit includes a driving transistor, a data writing transistor and a sensing transistor; the driving transistor and the data writing transistor are located at a first side of an aperture area of the each of the plurality of sub-pixels; the sensing transistor is located at a second side of the aperture area of the each of the plurality of sub-pixels; the first side and the second side are opposite sides of the aperture area along the extension direction of the plurality of data lines;
  a second electrode of the data writing transistor is coupled to a corresponding data line of the plurality of data lines; a gate electrode of the sensing transistor, and gate electrodes of data writing transistors in a next sub-pixel row of the plurality of sub-pixel rows adjacent the sensing transistor, are all coupled to a gate line of the plurality of gate lines corresponding to the next sub-pixel row adjacent the sensing transistor;
  the sub-pixel driving circuit further includes a storage capacitor coupled between a gate electrode of the driving transistor and a first electrode of the driving transistor; the storage capacitor includes a first electrode plate and a second electrode plate which are disposed oppositely; there is a first overlapping area between an orthographic projection of the first electrode plate to the base substrate and an orthographic projection of the second electrode plate to the base substrate; an orthographic projection of the first overlapping area to the base substrate at least partially overlaps an orthographic projection of the corresponding aperture area of the each of the plurality of sub-pixels.

Optionally, the first electrode plate of the storage capacitor includes a first transparent electrode plate, and the second electrode plate of the storage capacitor includes a second transparent electrode plate; the method further includes a step of forming the sub-pixel driving circuit, including:
  forming the first transparent electrode plate on a surface of the base substrate;
  forming a light-shielding layer which is in the same layer as the first transparent electrode plate;
  forming a buffer layer on one side of the light-shielding layer facing away from the base substrate, and forming a sixth via hole and a transition hole in the buffer layer in such a manner that a part of the light-shielding layer is exposed through the sixth via hole, and a part of the first transparent electrode plate is exposed through the transition hole;
  forming the first electrode of the driving transistor, a second electrode of the sensing transistor and a first conductive connection portion on one side of the buffer layer facing away from the base substrate, in such a manner that a first end of the first conductive connection portion is coupled to the first electrode of the driving transistor, a second end of the first conductive connection portion is coupled to the second electrode of the sensing transistor, the first conductive connection portion is reused as the second transparent electrode plate; the first electrode of the driving transistor is coupled to the light-shielding layer through the sixth via hole;
  forming a gate insulating layer on one side of the first electrode of the driving transistor facing away from the base substrate;
  forming the gate electrode of the driving transistor on one side of the gate insulating layer facing away from the base substrate;
  forming an interlayer insulating layer on one side of the gate electrode of the driving transistor facing away from the base substrate, and forming a first via hole, a third via hole and a fourth via hole in the interlayer insulating layer in such a manner that a portion of the gate electrode of the driving transistor is exposed through the first via hole, a portion of the first transparent electrode plate is exposed through the third via hole, an orthographic projection of the third via hole to the base substrate surrounds an orthographic projection of the transition hole to the base substrate, and a portion of the second transparent electrode plate is exposed through the fourth via hole;
  simultaneously forming a second conductive connection portion and a third conductive connection portion through a patterning process in such a manner that the second conductive connection portion is coupled to the gate electrode through the first via hole, the second conductive connection portion is coupled to the first transparent electrode plate through the third via hole, the second conductive connection portion is further coupled to the first electrode of the data writing transistor in the sub-pixel drive circuit, and the third conductive connection portion is coupled to the second transparent electrode plate through the fourth via hole.

Optionally, the method further includes a step of forming a light-emitting unit of each of the plurality of sub-pixels, including:

forming a passivation layer on one side of the sub-pixel driving circuit facing away from the base substrate;

forming a planarization layer on one side of the passivation layer facing away from the base substrate;

forming a fifth via hole that extends through the passivation layer and the planarization layer, wherein a part of the third conductive connection portion is exposed through the fifth via hole;

forming an anode on one side of the planarization layer facing away from the base substrate, wherein the anode is coupled to the third conductive connection portion through the fifth via hole;

forming a light-emitting layer on one side of the anode facing away from the base substrate;

forming a cathode on one side of the light-emitting layer facing away from the base substrate.

Based on the above technical solution of the display substrate, according to a fourth aspect of the present disclosure, a method for driving a display substrate is provided and includes: a power-on period and a power-off period;

wherein the power-on period includes a plurality of display cycles; in each of the plurality of display cycles, along an extension direction of data lines of the display substrate, writing first scanning signals into a plurality of gate lines of the display substrate one by one, wherein effective level periods of the first scanning signals input into adjacent gate lines partially overlap;

in two adjacent sub-pixel rows of the display substrate, when the first scanning signal written by the gate line corresponding to a preceding sub-pixel row is at an effective level and the first scanning signal written by the gate line corresponding to a subsequent sub-pixel row is at the effective level, turning on data writing transistors included in various sub-pixel driving circuits in the preceding sub-pixel row, to transmit a data signal written by the corresponding data line to which each of the data writing transistors is coupled, to a gate electrode of a corresponding driving transistor to which the each of the data writing transistors is coupled; meanwhile, turning on sensing transistors included in various sub-pixel driving circuits in the preceding sub-pixel row, to transmit a reset signal written by the corresponding sending signal line to which each of the sensing transistors is coupled, to a first electrode of corresponding driving transistor to which the each of the sensing transistors is coupled;

in the two adjacent sub-pixel rows of the display substrate, when the first scanning signal written by the gate line corresponding to the preceding sub-pixel row is at an ineffective level and the first scanning signal written by the gate line corresponding to the subsequent sub-pixel row is at the effective level, turning on the driving transistors and the sensing transistors in the preceding sub-pixel row to charge the corresponding sending signal line to which each of the sensing transistors is coupled;

in the two adjacent sub-pixel rows of the display substrate, when the first scanning signal written by the gate line corresponding to the preceding sub-pixel row is at the ineffective level and the first scanning signal written by the gate line corresponding to the subsequent sub-pixel row is at the ineffective level, turning on the driving transistors in the preceding sub-pixel row, turning off the sensing transistors in the preceding sub-pixel row, light-emitting units in the preceding sub-pixel row emitting light.

Optionally, the method further includes: in the power-off period, along the extension direction of the data lines of the display substrate, writing second scanning signals into the plurality of gate lines of the display substrate one by one; wherein each of the second scanning signals includes a first effective level period and a second effective level period arranged at intervals; for adjacent gate lines, the second effective level period of the second scanning signal input into a preceding gate line coincides with the first effective level period of the second scanning signal input into a subsequent gate line;

when the second scanning signal input into the preceding gate line is in the second effective level period, the data writing transistors and the sensing transistors included in the sub-pixel row corresponding to the preceding gate line are turned on;

in a first sub-period of the second effective level period, the data writing transistor transmits, an initialization signal written by the corresponding data line to which the data writing transistor is coupled, to the gate electrode of corresponding driving transistor to which the data writing transistor is coupled; the sensing transistor transmits, a reset signal written by the corresponding sending signal line to which the sensing transistor is coupled, to the first electrode of corresponding driving transistor to which the sensing transistors is coupled;

in a second sub-period of the second effective level period, the sensing signal line stops writing the initialization signal; the data writing transistor continues transmitting, the initialization signal written by the corresponding data line to which the data writing transistor is coupled, to the gate electrode of corresponding driving transistor to which the data writing transistor is coupled, so that the driving transistor is turned on to charge the corresponding sending signal line until a gate-source voltage of the driving transistor is equal to a threshold voltage of the driving transistor;

in a third sub-period of the second effective level period, the sensing transistor transmits, a voltage signal at the first electrode of the driving transistor to which the sensing transistor is coupled, to the sensing signal line to which the sensing transistor is coupled.

BRIEF DESCRIPTION OF THE DRAWINGS

The drawings described here are used to provide a further understanding of the present disclosure and constitute a part of the present disclosure. The exemplary embodiments and descriptions of the present disclosure are used to explain the present disclosure, and do not constitute an improper limitation to the present disclosure. In the attached drawing.

DETAILED DESCRIPTION

In order to further illustrate a display substrate and a method for manufacturing the same, a driving method and a display device provided in the embodiments of the present disclosure, detailed description is given below with reference to the accompanying drawings of the specification.

Figure 1:
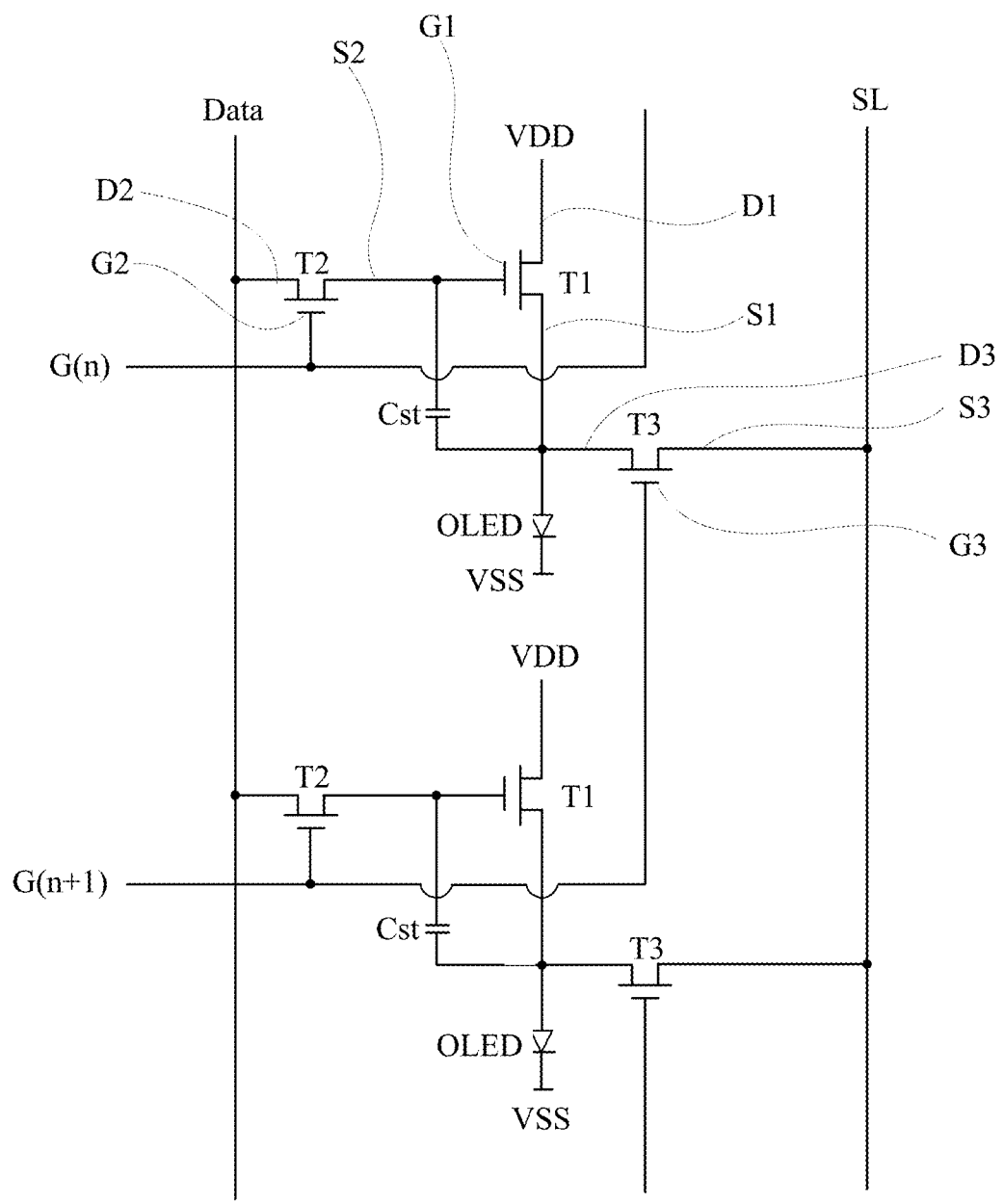
FIG. 1 is a schematic diagram of a sub-pixel driving circuit according to the present disclosure.

A display substrate provided in the present disclosure includes a transparent base substrate and a plurality of sub-pixels arranged on the base substrate. Each sub-pixel includes a sub-pixel driving circuit and a light-emitting unit. The structure of the sub-pixel driving circuit is various. For example, as shown in FIG. 1, the sub-pixel driving circuit includes a driving transistor T1, a data writing transistor T2, a sensing transistor T3 and a storage capacitor Cst. A second electrode D1 of the driving transistor T1 is coupled to a power signal line VDD. A gate electrode G1 of the driving transistor T1 is coupled to a first electrode plate of the storage capacitor Cst. A first electrode S1 of the driving transistor T1 is coupled to a second electrode plate of the storage capacitor Cst. A gate electrode G2 of the data writing transistor T2 is coupled to a corresponding gate line (such as G(n) and G(n+1)). A second electrode D2 of the data writing transistor T2 is coupled to a data line Data. A first electrode S2 of the data writing transistor T2 is coupled to the gate electrode G1 of the driving transistor T1. A gate electrode G3 of the sensing transistor T3 is coupled to a corresponding gate line. A first electrode S3 of the sensing transistor T3 is coupled to a sensing signal line SL. A second electrode D3 of the sensing transistor T3 is coupled to the first electrode S1 of the driving transistor T1. An anode of the light-emitting unit OLED is coupled to the first electrode S1 of the driving transistor T1. A cathode of the light-emitting unit OLED is coupled to a negative electrode VSS of a power supply.

Each sub-pixel includes an aperture area and a non-aperture area located at a periphery of the aperture area. When laying out the display substrate, the sub-pixel driving circuit included in the sub-pixel is generally disposed in the non-aperture area, the light-emitting unit and a color resist unit are generally disposed in the aperture area. In actual application, the sub-pixel driving circuit is used to provide a driving signal for the light-emitting unit to enable the light-emitting unit to emit light. The light emitted from the light-emitting unit passes through the color resist unit and then is emitted from the display substrate, thereby realizing the display function of the display device.

When the display substrate is laid out according to the above layout mode, the driving transistor T1, the sensing transistor T3, the data writing transistor T2 and the storage capacitor Cst included in each sub-pixel driving circuit are all located in the non-aperture area of the sub-pixel, resulting in that a layout space required for the non-aperture area is larger. However, an actual layout space of the non-aperture area is limited, thus an orthographic projection of the plates of the storage capacitor Cst to the base substrate will overlap with an orthographic projection of a signal line (such as a gate line) in the display substrate to the base substrate, and this causes the storage capacitor Cst to cross the line, which is likely to increase the risk of crosstalk.

Further, in order to improve driving performance of the sub-pixel driving circuit, transistors included in the sub-pixel driving circuit generally employ oxide transistors, and the oxide transistors require a larger layout space, which will further increase an area of the non-aperture area of the sub-pixel, and then affects an aperture ratio and service life of the display substrate.

In addition, due to limited layout space of the non-aperture area, when the space occupied by the transistor is large, the space occupied by the storage capacitor Cst will be smaller. Therefore, a capacitance value of the storage capacitor Cst will be smaller, which will adversely affect image quality uniformity of the display substrate.

Based on the above problems, the inventors of the present disclosure have discovered through research that the above problems can be solved by setting the storage capacitor Cst in the sub-pixel driving circuit as a transparent structure and arranging it in the aperture area of the sub-pixel.

Figure 2:
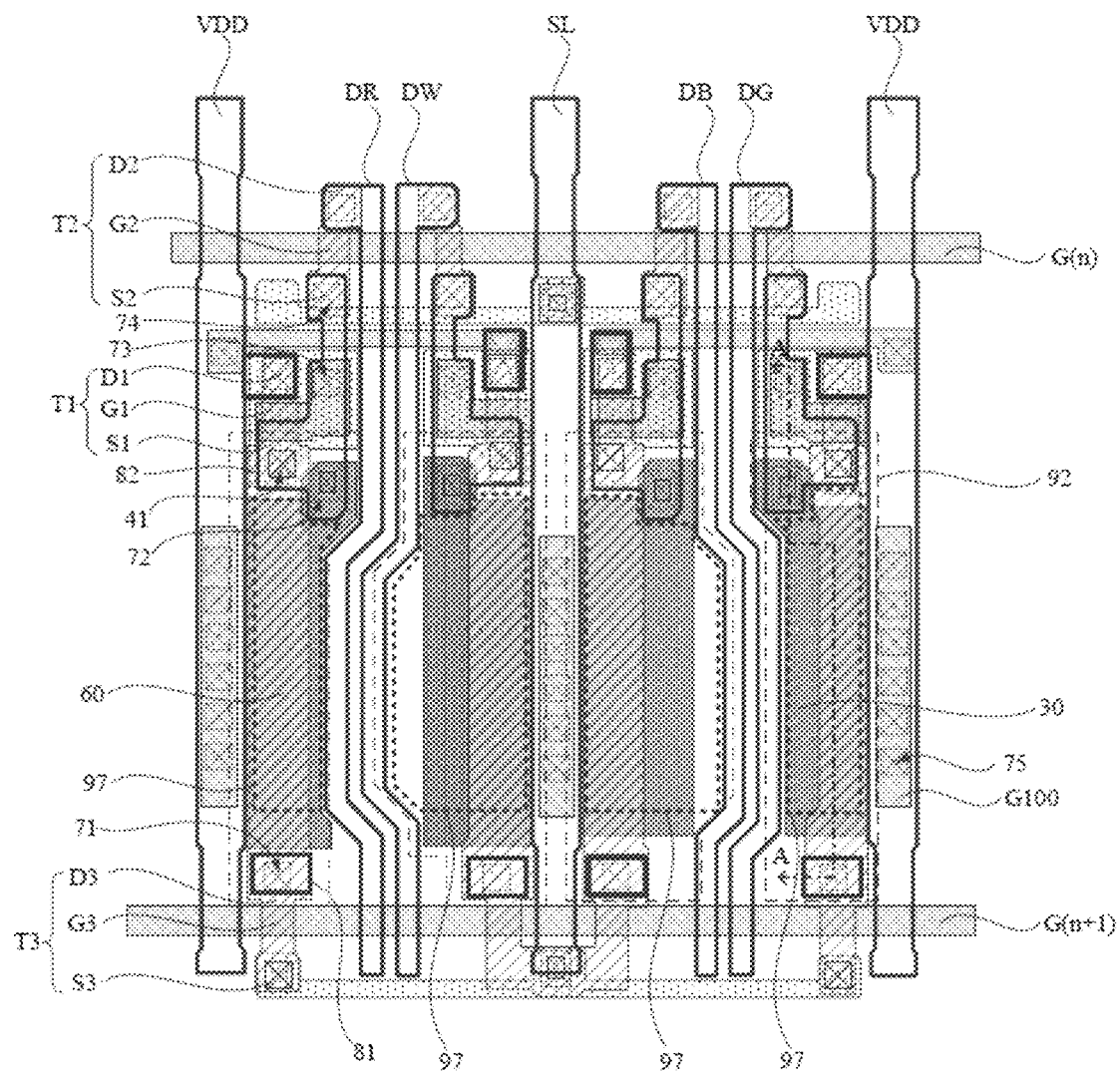
FIG. 2 is a schematic diagram of a layout of a pixel unit in a display substrate according to an embodiment of the present disclosure.
Figure 11:
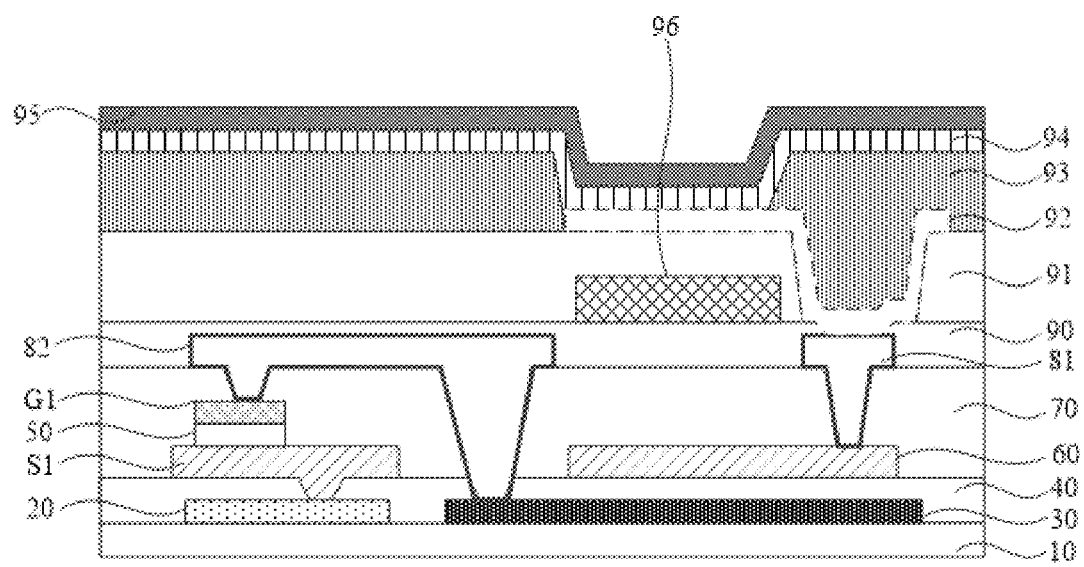
FIG. 11 is a schematic cross-sectional view along the AA direction in FIG. 2.

As shown in FIG. 2 and FIG. 11, one embodiment of the present disclosure provides a display substrate, including a base substrate 10, a plurality of gate lines (such as G(n) and G(n+1)) disposed on the base substrate 10, a plurality of data lines (such as DR, DW, DB, DG) disposed on the base substrate 10, and a plurality of sub-pixels disposed on the base substrate 10. The gate lines and the data lines are arranged to cross each other. The plurality of sub-pixels include a plurality of sub-pixel columns that are corresponding to the plurality of data lines in a one-to-one manner. Each sub-pixel column includes a plurality of the sub-pixels arranged along an extension direction of the data line. The plurality of sub-pixels include a plurality of sub-pixel rows that are corresponding to the plurality of gate lines in a one-to-one manner. Each sub-pixel row includes a plurality of the sub-pixels arranged along an extension direction of the gate line.

Each sub-pixel includes a sub-pixel driving circuit. The sub-pixel driving circuit includes a driving transistor T1, a data writing transistor T2 and a sensing transistor T3. The driving transistor T1 and the data writing transistor T2 are located at a first side of an aperture area of the sub-pixel. The sensing transistor T3 is located at a second side of the aperture area of the sub-pixel. The first side and the second side are opposite sides of the aperture area of the sub-pixel along the extension direction of the data line. A second electrode D2 of the data writing transistor T2 is coupled to a corresponding data line. The gate electrodes G3 of the sensing transistors T3 in a same sub-pixel row, and the gate electrodes G2 of the data writing transistors T2 in an adjacent next sub-pixel row, are all coupled to the gate line corresponding to the adjacent next sub-pixel row.

The sub-pixel driving circuit further includes a storage capacitor Cst coupled between a gate electrode G1 of the driving transistor T1 and a first electrode S1 of the driving transistor T1. The storage capacitor Cst includes a first electrode plate 30 and a second electrode plate which are disposed oppositely. There is a first overlapping area between an orthographic projection of the first electrode plate 30 to the base substrate 10 and an orthographic projection of the second electrode plate to the base substrate 10. An orthographic projection of the first overlapping area to the base substrate 10 at least partially overlaps an orthographic projection of an aperture area 97 of the corresponding sub-pixel to the base substrate 10.

Specifically, the display substrate employs a bottom emission structure. The base substrate 10 included in the display substrate may employ a transparent base substrate.

The plurality of sub-pixels included in the display substrate may be arranged in an array. The plurality of sub-pixels may be divided into a plurality of sub-pixel rows and a plurality of sub-pixel columns. Each sub-pixel row includes a plurality of the sub-pixels arranged along a second direction. Each sub-pixel column includes a plurality of the sub-pixels arranged along a first direction. For example, the first direction is the Y direction, and the second direction is the X direction.

Due to the limited layout space of the display substrate, in order to reduce the number of signals in the display substrate, the plurality of sub-pixel columns may be arranged in a one-to-one correspondence with the data lines, so that various sub-pixels in the same sub-pixel column share the same corresponding data line; the plurality of sub-pixel rows may be arranged in a one-to-one correspondence with the gate lines, so that various sub-pixels in the same sub-pixel row share the same corresponding gate line.

Specifically, in the sub-pixel driving circuit included in each sub-pixel, a gate electrode G2 of the data writing transistor T2 is coupled to a corresponding gate line; a second electrode D2 of the data writing transistor T2 is coupled to a corresponding data line; a first electrode S2 of the data writing transistor T2 is coupled to a gate electrode G1 of the driving transistor T1. A gate electrode G3 of the sensing transistor T3 is coupled to a gate line that is corresponding to adjacent next sub-pixel row. A first electrode S3 of the sensing transistor T3 is coupled to a first electrode S1 of the driving transistor T1. A second electrode D3 of the sensing transistor T3 is coupled to a corresponding sensing signal line SL.

In the sub-pixel driving circuit, the storage capacitor Cst may include a first electrode plate 30 and a second electrode plate which are disposed oppositely. The first electrode plate 30 is coupled to the gate electrode G1 of the driving transistor T1. The second electrode plate is coupled to the gate electrode G1 of the driving transistor T1. At least one part of the first electrode plate 30 and at least one part of the second electrode plate may be arranged in the aperture area 97 of the sub-pixel. For example, there is a first overlapping area between an orthographic projection of the first electrode plate 30 to the base substrate 10 and an orthographic projection of the second electrode plate to the base substrate 10. An orthographic projection of the first overlapping area to the base substrate 10 at least partially overlaps an orthographic projection of the corresponding aperture area 97 of the sub-pixel to the base substrate 10, or, the orthographic projection of the first overlapping area to the base substrate 10 is located within the orthographic projection of the corresponding aperture area 97 of the sub-pixel to the base substrate 10.

According to the forgoing specific structure of the display substrate, in the display substrate according to one embodiment of the present disclosure, when laying out the driving transistor T1, the data writing transistor T2 and the sensing transistor T3, the driving transistor T1 and the data writing transistor T2 are disposed at the first side of the aperture area of the sub-pixel, and the sensing transistor T3 is disposed at the second side of the aperture area of the sub-pixel, so that in adjacent sub-pixel rows, the sensing transistors T3 included in a preceding sub-pixel row can be close to the data writing transistors T2 included in a subsequent sub-pixel row. Meanwhile, the gate electrodes G3 of the sensing transistors T3 in the preceding sub-pixel row, and the gate electrodes G2 of the data writing transistors T2 in the subsequent sub-pixel row, are all coupled to the gate line corresponding to the subsequent sub-pixel row, so that the gate line corresponding to the subsequent sub-pixel row can simultaneously provide scanning signals to the gate electrodes G3 of the sensing transistors T3 in the preceding sub-pixel row, and the gate electrodes G2 of the data writing transistors T2 in the subsequent sub-pixel row. Therefore, in the display substrate according to one embodiment of the present disclosure, through the above layout mode, the sensing transistors T3 included in various sub-pixels in a same sub-pixel row, and the data writing transistors T2 included in various sub-pixels in an adjacent next sub-pixel row, can share an identical gate line, thereby reducing the number of signal lines and improving an aperture ratio of the pixel.

In addition, in the display substrate according to one embodiment of the present disclosure, at least one part of the storage capacitor Cst in the sub-pixel driving circuit is disposed in the aperture area 97 of the sub-pixel, which not only avoids cross-line situation when the entire storage capacitor Cst is disposed in the non-aperture area, thereby ensuring stable performance of the sub-pixel drive circuit, but also helps to increase capacitance of the storage capacitor Cst as the storage capacitor Cst has a large enough layout space, thereby improving display quality uniformity of the display substrate. In addition, arranging at least one part of the storage capacitor Cst of the sub-pixel driving circuit in the aperture area 97 of the sub-pixel, can also effectively reduce the area of the non-aperture area of the sub-pixel, thereby increasing the aperture ratio of the sub-pixel.

Specifically, in the traditional design, an 8K high resolution display substrate designed according to conventional design can achieve an average aperture ratio of about 12%. However, when the display substrate according to one embodiment of the present disclosure is manufactured as an 8K high resolution display substrate, an average aperture ratio can be increased to about 30%. Therefore, compared with the traditional design, the display substrate according to one embodiment of the present disclosure can increase the aperture ratio by about 150%, which significantly increases the service life of the product and provided technical support for the high-PPI bottom emission display field.

In some embodiments, the first electrode S2 of the data writing transistor T2 is located at a third side of the corresponding gate line; and the second electrode D2 of the data writing transistor T2 is located at a fourth side of the corresponding gate line. The third side and the fourth side are opposite along the extension direction of the data line. An orthographic projection of a channel portion of the data writing transistor T2 to the base substrate 10 is located within an orthographic projection of the corresponding gate line to the base substrate 10.

The first electrode S3 of the sensing transistor T3 is located at a third side of the gate line corresponding to the next sub-pixel row adjacent the sensing transistor T3. The second electrode D3 of the sensing transistor T3 is located at a fourth side of the gate line corresponding to the next sub-pixel row adjacent the sensing transistor T3. An orthographic projection of a channel portion of the sensing transistor T3 to the base substrate 10 is located with an orthographic projection of the gate line corresponding to the next sub-pixel row adjacent the sensing transistor T3, to the base substrate.

The gate line is simultaneously reused as the gate electrodes of various data writing transistors T2 in the corresponding sub-pixel row, and the gate electrodes of the sensing transistors T3 in the preceding sub-pixel row adjacent the corresponding sub-pixel row.

Specifically, when laying out the data writing transistor T2, the first electrode S2 of the data writing transistor T2 is located at the third side of the corresponding gate line; and the second electrode D2 of the data writing transistor T2 is located at the fourth side of the corresponding gate line, so that the channel portion of the data writing transistor T2, which connects both of the first electrode S2 of the data writing transistor T2 and the second electrode D2 of the data writing transistor T2, can be located near the gate line corresponding to the data writing transistor T2. Further, by setting the orthographic projection of the channel portion of the data writing transistor T2 to the base substrate 10 to be located within the orthographic projection of the corresponding gate line to the base substrate 10, the corresponding gate line can be directly reused as the gate electrode of the data writing transistor T2.

Similarly, when laying out the sensing transistor T3, the first electrode S3 of the sensing transistor T3 is located at the third side of the gate line corresponding to the next sub-pixel row adjacent the sensing transistor T3, and the second electrode D3 of the sensing transistor T3 is located at the fourth side of the gate line corresponding to the next sub-pixel row adjacent the sensing transistor T3, so that the channel portion of the sensing transistor T3, which connects both of the first electrode S3 of the sensing transistor T3 and the second electrode D3 of the sensing transistor T3, can be located near the gate line corresponding to the next sub-pixel row adjacent the sensing transistor T3. Further, by setting the orthographic projection of the channel portion of the sensing transistor T3 to the base substrate 10 to be located within the orthographic projection of the corresponding gate line to the base substrate 10, the corresponding gate line can be directly reused as the gate electrode of the sensing transistor T3.

When the sensing transistor T3 and the data writing transistor T2 are arranged in the above manner, both the sensing transistor T3 and the data writing transistor T2 can cross the gate line, so that the gate lines can be directly reused as the gate electrode of the sensing transistor T3 or the gate electrode of the data writing transistor T2, thereby reducing the space occupied by the sensing transistor T3 and the data writing transistor T2 and then improving pixel aperture ratio.

In some embodiments, the first electrode plate 30 of the storage capacitor includes a first transparent electrode plate, and the second electrode plate of the storage capacitor includes a second transparent electrode plate. The sub-pixel driving circuit further includes a first conductive connection portion 60.

A first end of the first conductive connection portion 60 is coupled to the first electrode S1 of the driving transistor T1. A second end of the first conductive connection portion 60 is coupled to the second electrode D3 of the sensing transistor T3. The first conductive connection portion 60 is reused as the second transparent electrode plate.

Specifically, the gate electrode G3 of the sensing transistor T3 may be coupled to a first scanning signal input terminal. The first electrode S3 of the sensing transistor T3 may be coupled to a sensing signal output terminal. The second electrode D3 of the sensing transistor T3 may be coupled to the first electrode S1 of the driving transistor T1.

When laying out the sensing transistor T3, the specific layout of the sensing transistor T3 is various. For example, the driving transistor T1 is located at a first side of the corresponding aperture area, the sensing transistor T3 is located at a second side of the corresponding aperture area, and the first side and the second side are opposite sides of the corresponding aperture area. In such layout, the sub-pixel driving circuit may further include the first conductive connection portion 60. The first end of the first conductive connection portion 60 is coupled to the first electrode S1 of the driving transistor T1, and the second end of the first conductive connection portion 60 is coupled to the second electrode D3 of the sensing transistor T3, thereby coupling the first electrode S1 of the driving transistor T1 with the second electrode D3 of the sensing transistor T3.

Further, an orthographic projection of the first conductive connection portion 60 to the base substrate 10 may at least partially overlap an orthographic projection of the aperture area 97 of the corresponding sub-pixel to the base substrate 10. Since the second transparent electrode plate of the storage capacitor Cst is coupled to the first electrode S1 of the driving transistor T1 and the second electrode D3 of the sensing transistor T3, respectively, the first conductive connection portion 60 may be reused as the second transparent electrode plate.

In the display substrate of the foregoing embodiment, the driving transistor T1 and the sensing transistor T3 are disposed at opposite sides of the aperture area 97; and the first conductive connection portion 60, which extends through the aperture area 97 and couples the first electrode S1 of the driving transistor T1 with the second electrode D3 of the sensing transistor T3, is reused as the second transparent electrode plate of the storage capacitor Cst. In this way, the space occupied by the sub-pixel driving circuit is effectively reduced, thereby effectively increasing the aperture ratio of the display substrate.

In addition, in the display substrate of the foregoing embodiment, the first electrode plate 30 of the storage capacitor includes the first transparent electrode plate, and the second electrode plate of the storage capacitor includes the second transparent electrode plate, so that when the first electrode plate 30 and the second electrode plate of the storage capacitor are arranged in the aperture area, the first electrode plate 30 and the second electrode plate do not affect light output of the aperture area, thereby ensuring a good light-emitting effect while increasing the aperture ratio of the sub-pixels of the display substrate.

As shown in FIG. 11, in some embodiments, the display substrate further includes a buffer layer 40 disposed on a surface of the base substrate 10. The first transparent electrode plate of the storage capacitor Cst is located between the buffer layer 40 and the base substrate 10. The second transparent electrode plate of the storage capacitor Cst is located on a surface of the buffer layer 40 facing away from the base substrate 10.

Specifically, the specific layout positions of the first transparent electrode plate and the second transparent electrode plate are various. For example, when the display substrate further includes the buffer layer 40 provided on the surface of the base substrate 10, the first transparent electrode plate is located between the buffer layer 40 and the base substrate 10, and the second transparent electrode plate is located on the surface of the buffer layer 40 facing away from the base substrate 10. Since the buffer layer 40 is thinner in a direction perpendicular to the base substrate 10, this layout makes a distance between the first transparent electrode plate and the second transparent electrode plate smaller, thereby increasing capacitance of the storage capacitor and improving display quality uniformity of the display substrate.

In some embodiments, there is a fifth overlapping area between the orthographic projection of the first overlapping area to the base substrate 10 and the orthographic projection of the aperture area of the corresponding sub-pixel to the substrate 10. An area of the fifth overlapping area is ¼ to ¾ of an area of the corresponding aperture area.

Specifically, under the condition that the capacitance of the storage capacitor Cst is sufficient, the area of the first transparent electrode plate and the second transparent electrode plate can be appropriately reduced. For example, there is a fifth overlapping area between the orthographic projection of the first overlapping area to the base substrate 10 and the orthographic projection of the aperture area of the corresponding sub-pixel to the substrate 10, and the area of the fifth overlapping area is ¼ to ¾ of the area of the corresponding aperture area. With such arrangement, under the condition that the capacitance of the storage capacitor Cst is sufficient, the first transparent electrode plate and the second transparent electrode plate occupy only a part of the aperture area, thereby increasing the luminous flux of short-wavelength light passing through the aperture area, ensuring transmittance of the aperture area to a certain extent, and providing basic support for high-resolution bottom emission display substrates.

Figure 4:
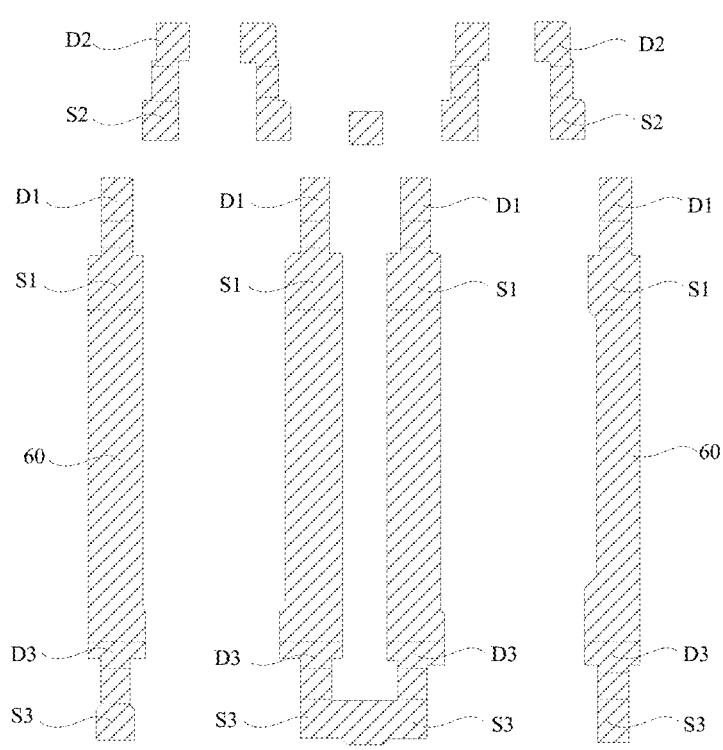
FIG. 4 is a schematic diagram of a layout of an active film layer according to an embodiment of the present disclosure.

As shown in FIG. 2 and FIG. 4, in some embodiments, the first conductive connection portion 60, the first electrode S1 of the driving transistor T1 and the second electrode D3 of the sensing transistor T3 are arranged in the same layer, and are all made of transparent oxide conductive material.

Specifically, when fabricating the driving transistor T1 and the sensing transistor T3, first forming an active pattern through oxide semiconductor material in such a manner that the active pattern includes a first part for forming the channel region of the driving transistor T1, and a second part for forming the channel region of the sensing transistor T3; doping other parts of the active pattern other than the first part and the second part to make the other parts become a transparent oxide conductor.

It should be noted that the other parts include the first electrode S1 and the second electrode D1 of the driving transistor T1, the first electrode S3 and the second electrode D3 of the sensing transistor T3, and the first conductive connection portion 60.

In the display substrate of the foregoing embodiment, the first conductive connection portion 60, the first electrode S1 of the driving transistor T1 and the second electrode D3 of the sensing transistor T3 are arranged in the same layer and made of the same material, so that the first conductive connection portion 60, the first electrode S1 of the driving transistor T1 and the second electrode D3 of the sensing transistor T3 can be formed in the same patterning process, thereby effectively simplifying the manufacturing process of the display substrate, and saving production costs.

Figure 6:
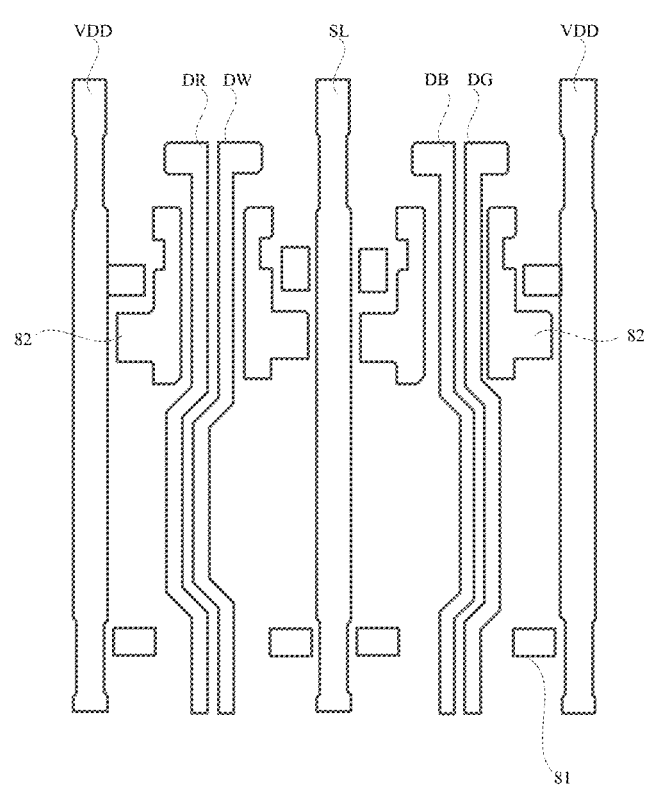
FIG. 6 is a schematic diagram of a layout of a source-drain metal layer according to an embodiment of the present disclosure.
Figure 7:
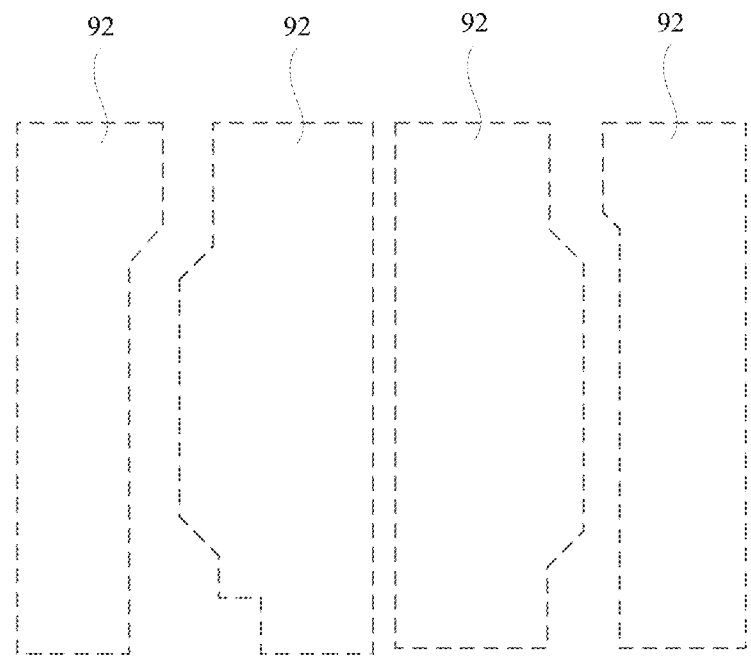
FIG. 7 is a schematic diagram of a layout of an anode according to an embodiment of the present disclosure.

As shown in FIG. 2 and FIG. 6, in some embodiments, the sub-pixel driving circuit further includes a second conductive connection portion 82.

The second conductive connection portion 82 is coupled to the first electrode S2 of the data writing transistor T2, the first transparent electrode plate and the gate electrode G1 of the driving transistor T1, respectively.

Specifically, the sub-pixel driving circuit may further include a data writing transistor T2. A gate electrode G2 of the data writing transistor T2 is coupled to a second scanning signal input terminal. A first electrode S2 of the data writing transistor T2 is coupled to the gate electrode G1 of the driving transistor T1. A second electrode D2 of the data writing transistor T2 is coupled to a data signal input terminal. The data writing transistor T2 is turned on in a data writing stage, under control of a second scanning signal input from the second scanning signal input terminal, to write a data signal input from the data signal input terminal into the gate electrode G1 of the driving transistor T1.

When laying out the data writing transistor T2, the specific layout of the data writing transistor T2 is various. For example, the data writing transistor T2 is located at one side of the driving transistor T1 away from the corresponding aperture area. In this layout mode, the sub-pixel driving circuit may include the second conductive connection portion 82. The second conductive connection portion 82 couples the first electrode S2 of the data writing transistor T2 with the first transparent electrode plate and the gate electrode G1 of the driving transistor T1.

In the display substrate of the foregoing embodiment, the data writing transistor T2 is located at one side of the driving transistor T1 away from the corresponding aperture area; the first electrode S2 of the data writing transistor T2, the first transparent electrode plate and the gate electrode G1 of the driving transistor T1 are coupled together via the second conductive connection portion 82, thereby effectively reducing the space occupied by the sub-pixel driving circuit, and then effectively improving the aperture ratio of the display substrate.

Figure 10:
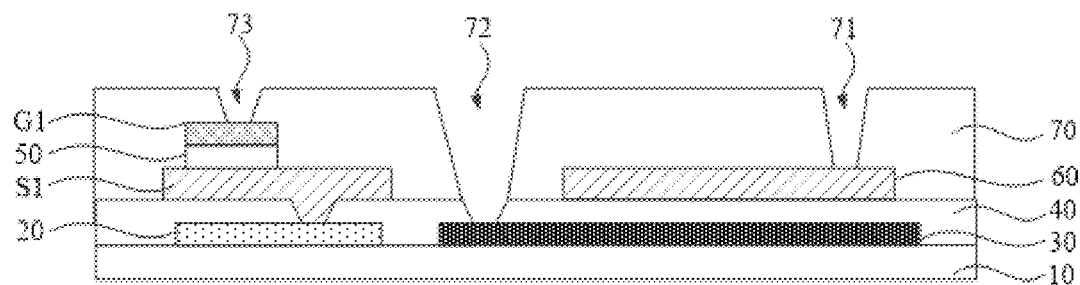
FIG. 10 is a schematic diagram of forming a via hole in an interlayer insulation layer according to an embodiment of the present disclosure.

As shown in FIG. 2 and FIG. 10, in some embodiments, there is a second overlapping area between an orthographic projection of the second conductive connection portion 82 to the base substrate 10 and an orthographic projection of the gate electrode G1 of the driving transistor T1 to the base substrate 10. The second conductive connection portion 82 is coupled to the gate electrode G1 of the driving transistor T1 through a first via hole 73 provided in the second overlapping area.

There is a third overlapping area between the orthographic projection of the second conductive connection portion 82 to the base substrate 10 and an orthographic projection of the first electrode of the data writing transistor to the base substrate 10. The second conductive connection portion 82 is coupled to the first electrode S2 of the data writing transistor T2 through a second via hole 74 provided in the third overlapping area.

There is a fourth overlapping area between the orthographic projection of the second conductive connection portion 82 to the base substrate 10 and an orthographic projection of the first transparent electrode plate to the base substrate 10. The second conductive connection portion 82 is coupled to the first transparent electrode plate through a third via hole 72 provided in the fourth overlapping area.

Specifically, the specific coupling manner of the second conductive connection portion 82, the first electrode S2 of the data writing transistor T2, the first transparent electrode plate and the gate electrode G1 of the driving transistor T1 may be determined according to the specific layout position of the second conductive connection portion 82. For example, when the second conductive connection portion 82 and each of the first electrode S2 of the data writing transistor T2, the first transparent electrode plate and the gate electrode G1 of the driving transistor T1 are in different layers, in a direction perpendicular to the base substrate 10, an overlapping area may be defined between the second conductive connection portion 82 and each of the first electrode S2 of the data writing transistor T2, the first transparent electrode plate and the gate electrode G1 of the driving transistor T1. In this way, the first electrode S2 of the data writing transistor T2, the first transparent electrode plate and the gate electrode G1 of the driving transistor T1 can be coupled together by the second conductive connection portion 82 through via holes in the corresponding overlapping areas.

It should be noted that due to the limited layout space of the display substrate, in actual layout, the second conductive connection portion 82, the first electrode S2 of the data writing transistor T2, the first transparent electrode plate and the gate electrode G1 of the driving transistor T1 may not be arranged in the same layer. In this case, the first electrode S2 of the data writing transistor T2, the first transparent electrode plate and the gate electrode G1 of the driving transistor T1 may be coupled together in the above manner.

As shown in FIG. 2, FIG. 10 and FIG. 11, in some embodiments, the sub-pixel driving circuit further includes a third conductive connection portion 81.

There is a sixth overlapping area between an orthographic projection of the third conductive connection portion 81 to the base substrate 10 and the orthographic projection of the first conductive connection portion 60 to the base substrate 10. The third conductive connection portion 81 is coupled to the first conductive connection portion 60 through a fourth via hole 71 provided in the sixth overlapping area.

The sub-pixel further includes a light-emitting unit disposed at one side of the sub-pixel driving circuit away from the base substrate. The light-emitting unit includes an anode 92, a light-emitting layer 94 and a cathode 95, which are sequentially stacked in a direction away from the base substrate 10. There is a seventh overlapping area between an orthographic projection of the anode 92 to the base substrate 10 and the orthographic projection of the third conductive connection portion 81 to the base substrate 10. The anode 92 is coupled to the third conductive connection portion 81 through a fifth via hole provided in the seventh overlapping area.

Specifically, the light-emitting unit may specifically include the anode 92, the light-emitting layer 94 and the cathode 95 which are sequentially stacked in a direction away from the base substrate 10. In order to receive a driving signal output by the first electrode S1 of the driving transistor T1, the anode 92 needs to be coupled to the first electrode S1 of the corresponding driving transistor T1. The light-emitting layer 94 may be made of organic light-emitting material. The light-emitting layer 94 can emit white light under the action of an electric field formed between the anode 92 and the cathode 95.

In the actual layout, the anode 92 of the light-emitting unit and the first electrode S1 of the driving transistor T1 are far apart, thus there is difficulty in directly coupling the anode 92 with the first electrode S1 of the driving transistor T1.

Therefore, it may be considered to directly couple the anode 92 with the first conductive connection portion 60 (i.e., the second transparent electrode plate), thereby coupling the anode 92 with the gate electrode G1 of the driving transistor T1 through the first conductive connection portion 60. However, since there are thick film layers between the anode 92 and the first conductive connection portion 60 in the direction perpendicular to the base substrate 10, if the anode 92 is directly coupled to the first conductive connection portion 60 through a via hole, on the one hand, the process is difficult and accuracy cannot be guaranteed; on the other hand, the anode 92 is deposited in a deep via hole and then is easily broken at a hole wall, and reliability cannot be guaranteed.

In view of this, in the display substrate of the foregoing embodiment, the third conductive connection portion 81 is provided in such a manner that the sixth overlapping area exists between the orthographic projection of the third conductive connection portion 81 to the base substrate 10 and the orthographic projection of the first conductive connection portion 60 to the base substrate 10, and the third conductive connection portion 81 may be coupled to the first conductive connection portion 60 through the fourth via hole 71 provided in the sixth overlapping area. Meanwhile, the seventh overlapping area exists between the orthographic projection of the anode 92 to the base substrate 10 and the orthographic projection of the third conductive connection portion 81 to the base substrate 10, and the anode 92 may be coupled to the third conductive connection portion 81 through the fifth via hole in the seventh overlapping area. In this way, the anode 92 is coupled to the first conductive connection portion 60 through the fifth via hole, the third conductive connection portion 81 and the fourth via hole 71.

The coupling manner of the anode 92 and the first conductive connection portion 60 provided in the foregoing embodiment not only has a simple implementation process and a high accuracy of via holes, but also ensures that the anode 92 has high reliability.

As shown in FIG. 11, in some embodiments, the orthographic projection of the anode 92 to the base substrate 10 overlaps the orthographic projection of the second transparent electrode plate of the storage capacitor Cst to the base substrate 10.

Specifically, the orthographic projection of the anode 92 to the base substrate 10 can overlap the orthographic projection of the corresponding second transparent electrode plate of the storage capacitor Cst to the base substrate 10. In this way, the storage capacitor Cst may be formed as a structure including the first transparent electrode plate, the second transparent electrode plate, and the anode 92 that are stacked, which is more conducive to capacitance adjustment of the storage capacitor Cst.

It is worth noting that the capacitance adjustment of the storage capacitor Cst is mainly between the first transparent electrode plate and the second transparent electrode plate. For the storage capacitor Cst of the above structure, the capacitance of the storage capacitor Cst may be adjusted to 0.12 pf, and the storage capacitor Cst of this capacitance can be applied to a high-resolution pixel circuit architecture to ensure the normal operation of the pixel driving circuit.

Figure 3:
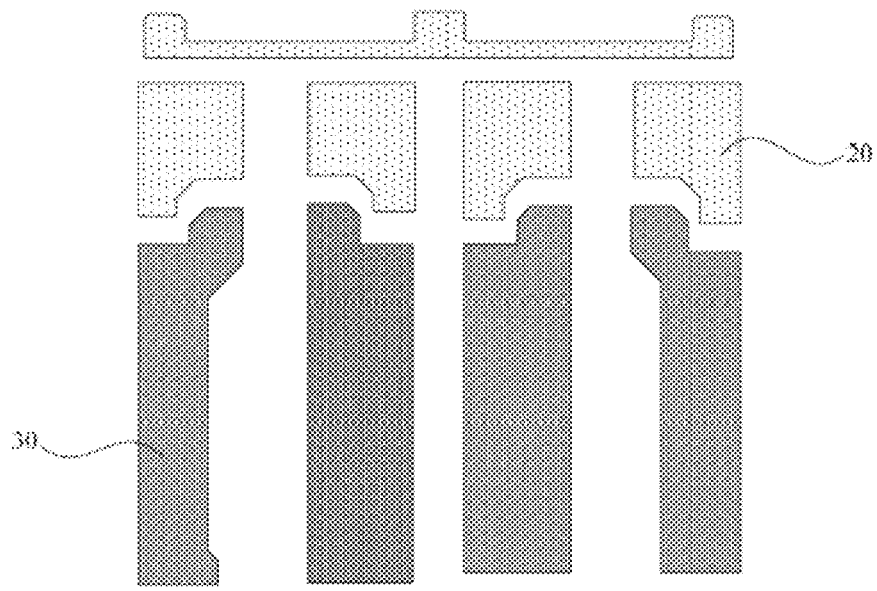
FIG. 3 is a schematic diagram of a layout of a light-shading layer and a first transparent plate according to an embodiment of the present disclosure.

As shown in FIG. 2 and FIG. 3, in some embodiments, the display substrate further includes a light-shielding layer 20 disposed on a surface of the base substrate 10. An orthographic projection of the light-shielding layer 20 to the base substrate 10 covers an orthographic projection of all of the driving transistors T1 to the base substrate 10.

Specifically, the display substrate may further include the light-shielding layer 20, and the orthographic projection of the light-shielding layer 20 to the base substrate 10 covers the orthographic projection of all of the driving transistors T1 to the base substrate 10. In this way, the light-shielding layer 20 can completely shield the driving transistors T1, thereby preventing external light from passing through the base substrate 10 to irradiate the driving transistors T1 and then ensuring the stable operation performance of the driving transistors T1.

In some embodiments, the first electrode plate 30 and the light-shielding layer 20 may be arranged in the same layer.

Specifically, the specific layout position of the first electrode plate 30 may be determined according to actual needs. For example, the first electrode plate 30 and the light-shielding layer 20 are arranged in the same layer. Since the light-shielding layer 20 occupies a smaller layout space, a region in the same layer as the light-shielding layer 20 further has a larger layout space. Therefore, arranging the first electrode plate 30 and the light-shielding layer 20 in the same layer can not only provide a larger layout space for the first electrode plate 30, but also is more conducive to the development of thinner display substrates.

Figure 8:
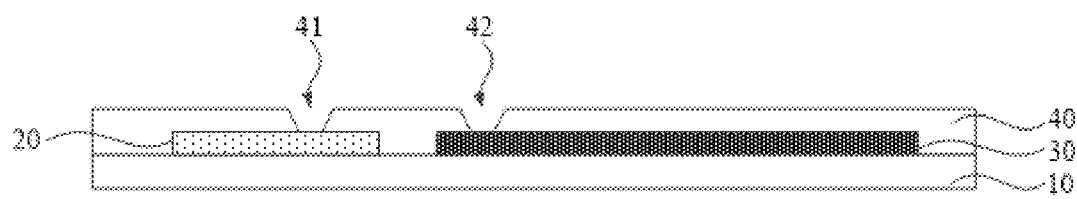
FIG. 8 is a schematic diagram of forming a via hole in a buffer layer according to an embodiment of the present disclosure.

As shown in FIG. 2, FIG. 8 and FIG. 10, in some embodiments, there is an eighth overlapping area between the orthographic projection of the light-shielding layer 20 to the base substrate 10 and the orthographic projection of the first electrode S1 of the driving transistor T1 to the base substrate 10. The light-shielding layer 20 is coupled to the first electrode S1 of the driving transistor T1 through a sixth via hole 41 disposed in the eighth overlapping area.

By coupling the light-shielding layer 20 to the first electrode S1 of the driving transistor T1 in the above manner, it is avoided that the light-shielding layer 20 is in a floating state, which affects the operation stability of the sub-pixel driving circuit.

Figure 12:
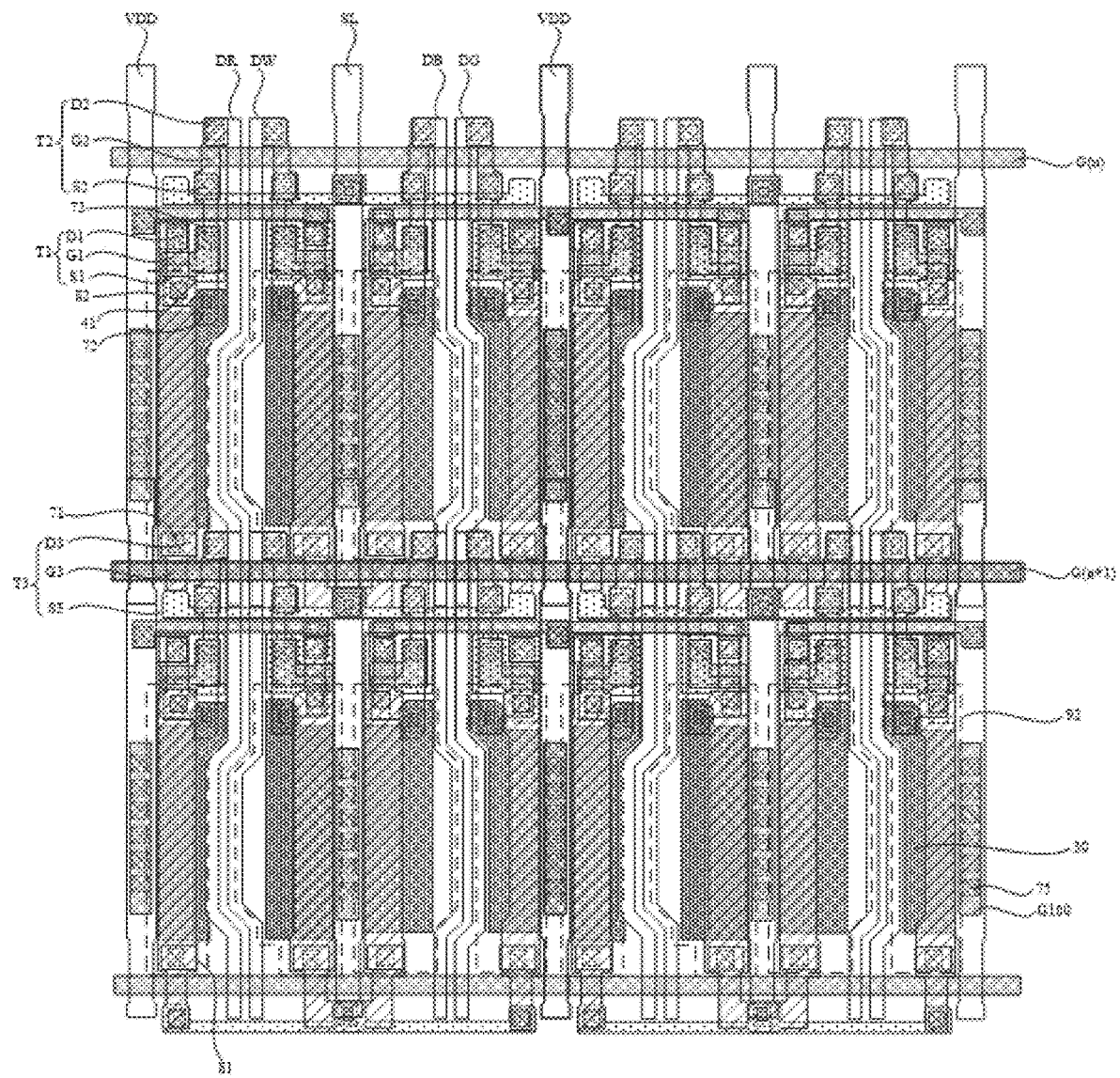
FIG. 12 is a schematic diagram of an overall layout of a display substrate according to an embodiment of the present disclosure.

As shown in FIG. 11 and FIG. 12, in some embodiments, the display substrate further includes:
- color resist patterns 96 corresponding to the sub-pixels in a one-to-one manner, where the color resist pattern 96 is located between the corresponding sub-pixel driving circuit and the light-emitting unit, and an orthographic projection of the color resist pattern 96 to the base substrate 10 overlaps an orthographic projection of the aperture area of the corresponding sub-pixel to the base substrate 10;
- a plurality of sensing signal lines SL and a plurality of power signal lines VDD; where the plurality of sensing signal lines SL and the plurality of power signal lines VDD all extend in the same direction as the extension direction of the data line;
- two sub-pixel columns between adjacent power signal line VDD and the sensing signal line SL, where two data lines corresponding to the two sub-pixel columns are located between the two sub-pixel columns, and the two sub-pixel columns are corresponding to the adjacent power signal line VDD;
- a plurality of pixel units defined by the plurality of sub-pixels; where each pixel unit includes at least three adjacent sub-pixels located in the same sub-pixel row, and colors of the color resist patterns corresponding to the at least three sub-pixels are different, the plurality of pixel units includes a plurality of pixel unit columns, each pixel unit column includes a plurality of the pixel units arranged along the extension direction of the data line, and the plurality of pixel unit columns have a one-to-one correspondence with the plurality of sensing signal lines SL.

In the sub-pixel driving circuit included in each sub-pixel, the gate electrode of the driving transistor is coupled to the first electrode of the data writing transistor; the second electrode D1 of the driving transistor T1 is coupled to the corresponding power signal line VDD; the second electrode D3 of the sensing transistor T3 is coupled to the corresponding sensing signal line SL.

Specifically, when laying out the power supply signal line VDD and the sensing signal line SL, the power supply signal lines VDD and the sensing signal lines SL may be alternately arranged, and two sub-pixel columns are arranged between each power supply signal line VDD and the sensing signal line SL adjacent the each power supply signal line VDD. The two sub-pixel columns are corresponding to the adjacent power supply signal line VDD, and various sub-pixels in the two sub-pixel columns share the same corresponding power signal line VDD.

The plurality of sub-pixels may constitute a plurality of pixel units. For example, each pixel unit includes at least three adjacent sub-pixels located in the same sub-pixel row, and the colors of the color resist patterns corresponding to the at least three sub-pixels are different. The plurality of pixel units may be divided into a plurality of pixel unit columns. Each pixel unit column includes a plurality of the pixel units arranged along the first direction. The plurality of pixel unit columns have a one-to-one correspondence with the plurality of sensing signal lines SL. Sub-pixels included in various pixel units in the same pixel unit column share the same corresponding sensing signal line SL.

When the various signal lines and sub-pixels in the display substrate are laid out in the above manner, it can not only improve the pixel aperture ratio by minimizing the number of signal lines while ensuring the normal operation of the display substrate, but also meet requirements of large size and high resolution of the display substrate.

In some embodiments, the color resist patterns corresponding to the at least three sub-pixels included in each pixel unit specifically include: a red color resist pattern, a white color resist pattern, a blue color resist pattern, and a green color resist pattern.

Specifically, each pixel unit may include four adjacent sub-pixels located in the same sub-pixel row, and the four sub-pixels are corresponding to the red color resist pattern, the white color resist pattern, the blue color resist pattern and the green color resist pattern in a one-to-one manner.

When the display substrate adopts a bottom emission design, the color resist patterns may be arranged between the sub-pixel driving circuits and the light-emitting unit. White light emitted by the light-emitting unit in the sub-pixel can pass through the corresponding color resist patterns and finally is emitted from the display substrate.

Figure 5:
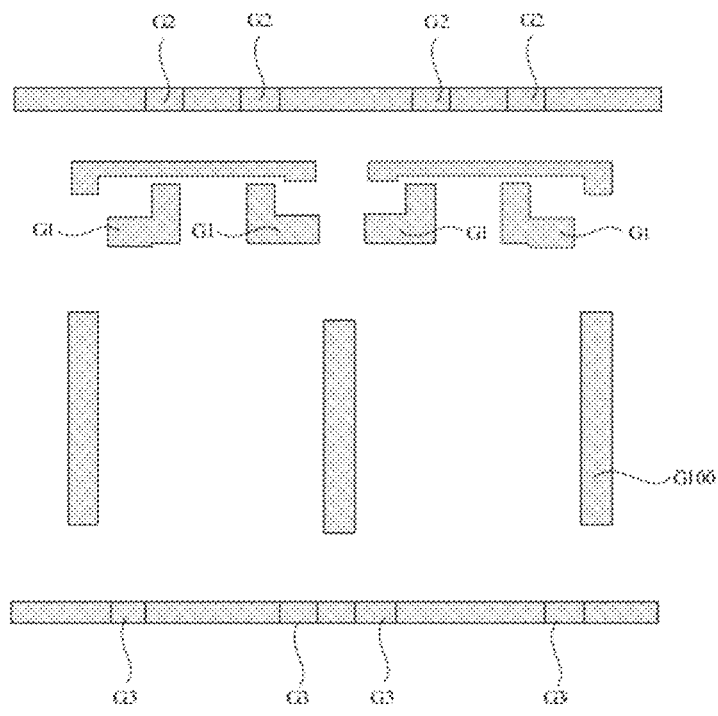
FIG. 5 is a schematic diagram of a layout of a gate metal layer according to an embodiment of the present disclosure.

As shown in FIG. 2 and FIG. 5, in some embodiments, the display substrate further includes a fourth conductive connection portion G100 corresponding to the power signal line VDD in a one-to-one manner. There is a ninth overlapping area between an orthographic projection of the fourth conductive connection portion G100 to the base substrate 10 and an orthographic projection of the corresponding power signal line VDD to the base substrate 10. The fourth conductive connection portion G100 is coupled to the corresponding power signal line VDD through at least one seventh via hole 75 in the ninth overlapping area.

Specifically, an extension direction of the fourth conductive connection portion G100 is the same as an extension direction of the power signal line VDD. The fourth conductive connection portion G100 may be arranged in a different layer from the power signal line VDD. The ninth overlapping area is formed between the fourth conductive connection portion G100 and the corresponding power signal line VDD in the direction perpendicular to the base substrate 10. The fourth conductive connection portion G100 is coupled to the corresponding power signal line VDD through at least one seventh via hole 75 in the ninth overlapping area. In this way, the voltage drop generated on the power signal line VDD can be effectively reduced.

As shown in FIG. 4, in some embodiments, the fourth conductive connection portion G100 and the gate electrode G1 of the driving transistor T1 are provided in the same layer and made of the same material.

Specifically, the fourth conductive connection portion G100 and the gate electrode G1 of the driving transistor T1 are arranged in the same layer and made of the same material, so that the fourth conductive connection portion G100 and the gate electrode G1 of the driving transistor T1 can be formed in one same patterning process, thereby avoiding an additional process specifically used for forming the fourth conductive connection part G100.

One embodiment of the present disclosure further provides a display device, including the display substrate provided in the foregoing embodiment.

In the display substrate according to the foregoing embodiment of the present disclosure, the sensing transistors T3 included in various sub-pixels in a same sub-pixel row, and the data writing transistors T2 included in various sub-pixels in an adjacent next sub-pixel row, can share an identical gate line, thereby reducing the number of signal lines and improving an aperture ratio of the pixel. Further, in the display substrate according to the foregoing embodiment of the present disclosure, at least one part of the storage capacitor Cst in the sub-pixel driving circuit is disposed in the aperture area of the sub-pixel, which not only avoids cross-line situation when the entire storage capacitor Cst is disposed in the non-aperture area, thereby ensuring stable performance of the sub-pixel drive circuit, but also helps to increase capacitance of the storage capacitor Cst as the storage capacitor Cst has a large enough layout space, thereby improving display quality uniformity of the display substrate. In addition, in the display substrate according to the foregoing embodiment of the present disclosure, arranging at least one part of the storage capacitor Cst of the sub-pixel driving circuit in the aperture area of the sub-pixel, can also effectively reduce the area of the non-aperture area of the sub-pixel, thereby increasing the aperture ratio of the sub-pixel.

Therefore, when the display device according to one embodiment of the present disclosure includes the above display substrate, the display device also has the above beneficial effects, which will not be repeated here.

It should be noted that the display device may be any product or component with a display function, such as a TV, a monitor, a digital photo frame, a mobile phone, a tablet computer.

One embodiment of the present disclosure further provides a method for manufacturing the display substrate provided in the foregoing embodiment, and the method includes:

forming a plurality of gate lines, a plurality of data lines and a plurality of sub-pixels on a base substrate 10 in such a manner that: the gate lines and the data lines are arranged to cross each other, the plurality of sub-pixels include a plurality of sub-pixel columns that are corresponding to the plurality of data lines in a one-to-one manner, each sub-pixel column includes a plurality of the sub-pixels arranged along an extension direction of the data line, the plurality of sub-pixels include a plurality of sub-pixel rows that are corresponding to the plurality of gate lines in a one-to-one manner, each sub-pixel row includes a plurality of the sub-pixels arranged along an extension direction of the gate line;

each sub-pixel includes a sub-pixel driving circuit; the sub-pixel driving circuit includes a driving transistor T1, a data writing transistor T2 and a sensing transistor T3; the driving transistor T1 and the data writing transistor T2 are located at a first side of an aperture area of the sub-pixel; the sensing transistor T3 is located at a second side of the aperture area of the sub-pixel; the first side and the second side are opposite sides of the aperture area of the sub-pixel along the extension direction of the data line; a second electrode D2 of the data writing transistor T2 is coupled to a corresponding data line; the gate electrodes G3 of the sensing transistors T3 in a same sub-pixel row, and the gate electrodes G2 of the data writing transistors T2 in an adjacent next sub-pixel row, are all coupled to the gate line corresponding to the adjacent next sub-pixel row;

the sub-pixel driving circuit further includes a storage capacitor Cst coupled between a gate electrode G1 of the driving transistor T1 and a first electrode S1 of the driving transistor T1; the storage capacitor Cst includes a first electrode plate 30 and a second electrode plate which are disposed oppositely; there is a first overlapping area between an orthographic projection of the first electrode plate 30 to the base substrate 10 and an orthographic projection of the second electrode plate to the base substrate 10; an orthographic projection of the first overlapping area to the base substrate 10 at least partially overlaps an orthographic projection of an aperture area of the corresponding sub-pixel to the base substrate 10.

In the display substrate manufactured according to the method of the embodiment of the present disclosure, when laying out the driving transistor T1, the data writing transistor T2 and the sensing transistor T3, the driving transistor T1 and the data writing transistor T2 are disposed at the first side of the aperture area of the sub-pixel, and the sensing transistor T3 is disposed at the second side of the aperture area of the sub-pixel, so that in adjacent sub-pixel rows, the sensing transistors T3 included in a preceding sub-pixel row can be close to the data writing transistors T2 included in a subsequent sub-pixel row. Meanwhile, the gate electrodes G3 of the sensing transistors T3 in the preceding sub-pixel row, and the gate electrodes G2 of the data writing transistors T2 in the subsequent sub-pixel row, are all coupled to the gate line corresponding to the subsequent sub-pixel row, so that the gate line corresponding to the subsequent sub-pixel row can simultaneously provide scanning signals to the gate electrodes G3 of the sensing transistors T3 in the preceding sub-pixel row, and the gate electrodes G2 of the data writing transistors T2 in the subsequent sub-pixel row. Therefore, in the display substrate manufactured according to the method of the embodiment of the present disclosure, through the above layout mode, the sensing transistors T3 included in various sub-pixels in a same sub-pixel row, and the data writing transistors T2 included in various sub-pixels in an adjacent next sub-pixel row, can share an identical gate line, thereby reducing the number of signal lines and improving an aperture ratio of the pixel.

In addition, in the display substrate manufactured according to the method of the embodiment of the present disclosure, at least one part of the storage capacitor Cst in the sub-pixel driving circuit is disposed in the aperture area of the sub-pixel, which not only avoids cross-line situation when the entire storage capacitor Cst is disposed in the non-aperture area, thereby ensuring stable performance of the sub-pixel drive circuit, but also helps to increase capacitance of the storage capacitor Cst as the storage capacitor Cst has a large enough layout space, thereby improving display quality uniformity of the display substrate. In addition, in the display substrate manufactured according to the method of the embodiment of the present disclosure, arranging at least one part of the storage capacitor Cst of the sub-pixel driving circuit in the aperture area of the sub-pixel, can also effectively reduce the area of the non-aperture area of the sub-pixel, thereby increasing the aperture ratio of the sub-pixel.

Figure 9:
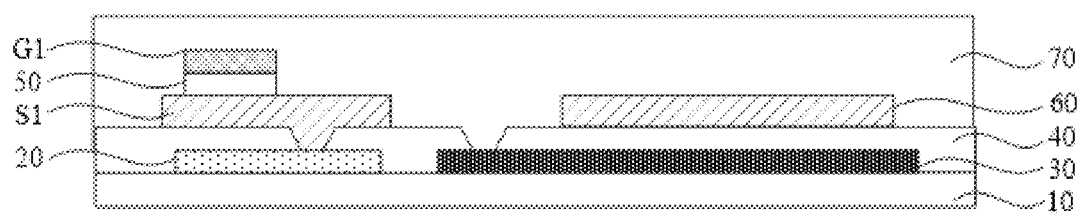
FIG. 9 is a schematic diagram of forming an active film layer and a gate according to an embodiment of the present disclosure.

In some embodiments, the first electrode plate 30 of the storage capacitor includes a first transparent electrode plate, and the second electrode plate of the storage capacitor includes a second transparent electrode plate. The step of forming the sub-pixel driving circuit specifically includes:

as shown in FIG. 2, FIG. 3 and FIG. 8, forming the first transparent electrode plate on a surface of the base substrate 10;

as shown in FIG. 2, FIG. 3, and FIG. 8, forming a light-shielding layer 20 which is in the same layer as the first transparent electrode plate;

as shown in FIG. 8, forming a buffer layer 40 on one side of the light-shielding layer 20 facing away from the base substrate 10, and forming a sixth via hole 41 and a transition hole 42 in the buffer layer 40 in such a manner that a part of the light-shielding layer 20 is exposed through the sixth via hole 41, and a part of the first transparent electrode plate is exposed through the transition hole 42;

as shown in FIG. 4 and FIG. 9, forming the first electrode S1 of the driving transistor T1, the second electrode D3 of the sensing transistor T3 and the first conductive connection portion 60 on one side of the buffer layer 40 facing away from the base substrate 10, in such a manner that a first end of the first conductive connection portion 60 is coupled to the first electrode S1 of the driving transistor T1, a second end of the first conductive connection portion 60 is coupled to the second electrode D3 of the sensing transistor T3, the first conductive connection portion 60 is reused as the second transparent electrode plate; the first electrode S1 of the driving transistor T1 is coupled to the light-shielding layer 20 through the sixth via hole 41;

as shown in FIG. 9, forming a gate insulating layer 50 on one side of the first electrode S1 of the driving transistor T1 facing away from the base substrate 10;

as shown in FIG. 9, forming the gate electrode of the driving transistor on one side of the gate insulating layer 50 facing away from the base substrate 10;

as shown in FIG. 9 and FIG. 10, forming an interlayer insulating layer 70 on one side of the gate electrode of the driving transistor facing away from the base substrate 10, and forming a first via hole 73, a third via hole 72 and a fourth via hole 71 in the interlayer insulating layer 70 in such a manner that a portion of the gate electrode of the driving transistor is exposed through the first via hole 73, a portion of the first transparent electrode plate is exposed through the third via hole 72, an orthographic projection of the third via hole 72 to the base substrate 10 surrounds an orthographic projection of the transition hole 42 to the base substrate 10, and a portion of the second transparent electrode plate is exposed through the fourth via hole 71;

as shown in FIG. 6 and FIG. 11, simultaneously forming a second conductive connection portion 82 and a third conductive connection portion 81 through a patterning process in such a manner that the second conductive connection portion 82 is coupled to the gate electrode through the first via hole 73, the second conductive connection portion 82 is coupled to the first transparent electrode plate through the third via hole 72, the second conductive connection portion 82 is further coupled to the first electrode S2 of the data writing transistor T2 in the sub-pixel drive circuit, and the third conductive connection portion 81 is coupled to the second transparent electrode plate through the fourth via hole 71.

Specifically, a first transparent film may be first formed on a surface of the base substrate 10 through indium tin oxide (ITO) material; then the first transparent film may be patterned to form the first transparent electrode plate. After the first transparent electrode plate is formed, the light-shielding layer 20 is formed on the surface of the base substrate 10 through a patterning process. The light-shielding layer 20 may be made of metal materials, which are not limited thereto.

It is worth noting that in the process of forming the first transparent electrode plate, an etching solution used in the etching process is generally oxalic acid, and in the process of forming the light-shielding layer 20, an etching solution used in the etching process is generally hydrogen peroxide solution as hydrogen peroxide solution has no effect on the indium tin oxide material. Therefore, during production, the first transparent electrode plate is generally fabricated first, and then the light-shielding layer 20 is fabricated.

After the first transparent electrode plate and the light-shielding layer 20 are fabricated, the buffer layer 40 may be deposited on one side of the light-shielding layer 20 facing away from the base substrate 10. The buffer layer 40 covers the entire surface of the base substrate 10. After the buffer layer 40 is formed via deposition, a dry etching process may be performed on the buffer layer 40 to form the sixth via hole 41 and the transition hole 42. At least a part of the light-shielding layer 20 is exposed through the sixth via hole 41. At least a part of the first transparent electrode plate is exposed through the transition hole 42.

After completing the fabrication of the buffer layer 40, an active layer film may be fabricated on one side of the buffer layer 40 facing away from the base substrate 10, and the active layer film may be patterned to form a first active pattern and a second active pattern. The first active pattern is corresponding to the channel region of the driving transistor T1, the channel region of the data writing transistor T2 and the channel region of the sensing transistor T3. The second active pattern is corresponding to the first electrode S1 and the second electrode of the driving transistor T1, the first electrode S2 and the second electrode of the data writing transistor T2, the first electrode S3 and the second electrode of the sensing transistor T3 and the first conductive connection portion 60.

It is worth noting that the specific material of the active layer film may be selected according to actual needs. For example, an oxide conductive material (such as indium gallium zinc oxide) is used to fabricate the active layer film; after the first active pattern and the second active pattern are formed via the patterning process, the first active pattern may be doped to change the material of the first active pattern into an oxide semiconductor material. Alternatively, an oxide semiconductor material is used to fabricate the active layer film; after the first active pattern and the second active pattern are formed via the patterning process, the second active pattern may be doped to change the material of the second active pattern into an oxide conductive material.

The formed first conductive connection portion 60 may be reused as the second transparent electrode plate. The first electrode S1 of the driving transistor T1 may be coupled to the light-shielding layer 20 through the sixth via hole 41.

After the channel region, the first electrode and the second electrode of each transistor have been fabricated, the gate insulating layer 50 may be formed. Then, the gate electrode G1 of the driving transistor T1, the gate electrode G2 of the data writing transistor T2, and the gate electrode G3 of the sensing transistor T3 are fabricated on one surface of the gate insulating layer 50 facing away from the base substrate 10. The gate electrode G1 of the driving transistor T1 covers the channel region corresponding to the driving transistor T1. The gate electrode G2 of the data writing transistor T2 covers the channel region corresponding to the data writing transistor T2. The gate electrode G3 of the sensing transistor T3 covers the channel region corresponding to the sensing transistor T3.

After the gate electrodes of various transistors have been fabricated, the interlayer insulating layer 70 covering the entire area of the base substrate 10 may be formed. Then, the first via hole 73, the third via hole 72 and the fourth via hole 71 may be defined in the interlayer insulating layer 70. At least a part of the gate electrode G1 of the driving transistor T1 may be exposed through the first via hole 73. At least a part of the first transparent electrode plate may be exposed through the third via hole 72. An orthographic projection of the third via hole 72 to the base substrate 10 surrounds an orthographic projection of the transition hole 42 to the base substrate 10. At least a part of the second transparent electrode plate may be exposed through the fourth via hole 71.

It is worth noting that the thickness of the interlayer insulating layer 70 is relatively thick, which is generally twice the thickness of the buffer layer 40. Thus, the buffer layer 40 may be pre-etched to form the transition hole 42, and then the third via hole 72 is formed in the interlayer insulating layer 70, which is more conducive to implementation of the drilling process.

After completing the fabrication of the via holes in the interlayer insulating layer 70, a metal film may be formed on one side of the interlayer insulating layer 70 away from the base substrate 10. Then, an etching process is performed on the metal film to simultaneously form the second conductive connection portion 82 and the third conductive connection portion 81. The second conductive connection portion 82 is coupled to the gate electrode through the first via hole 73. The second conductive connection portion 82 is coupled to the first transparent electrode plate through the third via hole 72. The second conductive connection portion 82 is further coupled to the first electrode S2 of the data writing transistor T2 in the sub-pixel driving circuit. The third conductive connection portion 81 is coupled to the second transparent electrode plate through the fourth via hole 71.

As shown in FIG. 11, in some embodiments, the step of forming the light-emitting unit specifically includes:

forming a passivation layer 90 on one side of the sub-pixel driving circuit facing away from the base substrate 10;

forming a planarization layer 91 on one side of the passivation layer 90 facing away from the base substrate 10;

forming a fifth via hole that extends through the passivation layer 90 and the planarization layer 91, where a part of the third conductive connection portion 81 is exposed through the fifth via hole;

forming an anode 92 on one side of the planarization layer 91 facing away from the base substrate 10, where the anode 92 is coupled to the third conductive connection portion 81 through the fifth via hole;

forming a light-emitting layer 94 on one side of the anode 92 facing away from the base substrate 10;

forming a cathode 95 on one side of the light-emitting layer 94 facing away from the base substrate 10.

Specifically, after the fabrication of the sub-pixel driving circuit, the passivation layer 90 may be formed on one side of the sub-pixel driving circuit facing away from the base substrate 10, and the planarization layer 91 is formed on one side of the passivation layer 90 facing away from the base substrate 10. The fifth via hole is defined through the passivation layer 90 and the planarization layer 91. A part of the third conductive connection portion 81 is exposed through the fifth via hole.

After the fifth via hole is formed, the anode 92 may be formed on one surface of the planarization layer 91 facing away from the base substrate 10. One part of the anode 92 is formed in the fifth via hole. The anode 92 is coupled to the third conductive connection portion 81 through the fifth via hole.

After the anode 92 is formed, an evaporation process can be used to form a pixel defining layer 93 and a light-emitting layer 94 on one side of the anode 92 facing away from the base substrate 10. Finally, the cathode 95 is formed on one side of the light-emitting layer 94 facing away from the base substrate 10.

In the method for manufacturing the display substrate according to the foregoing embodiment, the following film layers are sequentially formed: the first transparent electrode plate, the light-shielding layer 20, the buffer layer 40, the active layer (as shown in FIG. 4), the gate insulating layer 50, a gate metal layer (as shown in FIG. 5), the interlayer insulating layer 70, a source and drain metal layer (as shown in FIG. 6), the passivation layer 90, the planarization layer 91, the anode 92, the pixel defining layer 93, the light emitting layer 94 and the cathode 95.

The first transparent electrode plate and the light-shielding layer 20 are arranged in the same layer, and both are arranged on the surface of the base substrate 10. The first transparent electrode plate and the light-shielding layer 20 are made by two patterning processes.

The buffer layer 40 covers the first transparent electrode plate and the light-shielding layer 20, and a patterning process needs to be performed to perforate the buffer layer 40.

The active layer is used to form the active pattern of the channel region of each transistor, the first electrode and the second electrode of each transistor, and the first conductive connection portion 60, and these structures may be formed from the active layer through one patterning process.

The gate metal layer is used to form the gate electrode of each transistor, the gate lines in the display substrate and the fourth conductive connection part G100, and these structures may be formed through one patterning process.

The interlayer insulating layer 70 covers the gate electrodes of the various transistors, the gate lines in the display substrate, and the fourth conductive connection portion G100, and one patterning process is required to perforate the interlayer insulating layer 70.

The source and drain metal layer is used to form the second conductive connection portion 82 and the third conductive connection portion 81. The process of forming the second conductive connection portion 82 and the third conductive connection portion 81 requires one patterning process.

One patterning process is required for each of the passivation layer 90 and the planarization layer 91 to perform perforation. The process of forming each of the anode 92 and the pixel defining layer 93 requires one patterning process.

Therefore, as can be seen from the above production process of the forgoing method, eleven patterning processes needs to be performed.

One embodiment of the present disclosure further provides a method for driving a display substrate, including a power-on period and a power-off period.

Figure 13:
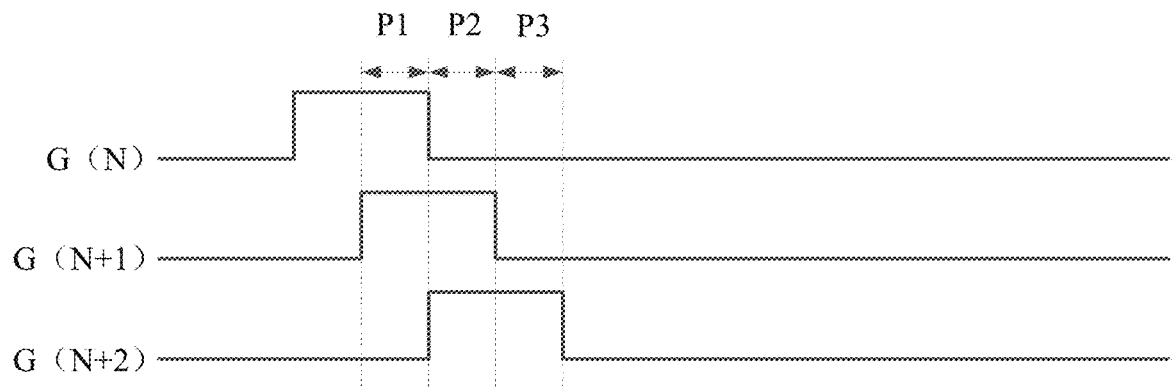
FIG. 13 is a schematic driving timing diagram of a gate of a display substrate during a startup period according to an embodiment of the present disclosure.

As shown in FIG. 13, the power-on period includes multiple display cycles. In each display cycle,
- along an extension direction of data lines in the display substrate, writing a first scanning signal into a plurality of gate lines (such as G(N), G(N+1) and G(N+2)) one by one, where effective level periods of the first scanning signals input into adjacent gate lines partially overlap (for example, P1 and P2);
- in the two adjacent sub-pixel rows of the display substrate, when the first scanning signal written by the gate line corresponding to the preceding sub-pixel row is at an effective level (high level) and the first scanning signal written by the gate line corresponding to the subsequent sub-pixel row is at the effective level, for example, in the P1 period, turning on the data writing transistors T2 included in various sub-pixel driving circuits in the preceding sub-pixel row, to transmit a data signal written by the corresponding data line to which each of the data writing transistors T2 is coupled, to the gate electrode G1 of corresponding driving transistor T1 to which the each of the data writing transistors T2 is coupled; meanwhile, turning on the sensing transistors T3 included in various sub-pixel driving circuits in the preceding sub-pixel row, to transmit a reset signal written by the corresponding sending signal line to which each of the sensing transistors T3 is coupled, to the first electrode S1 of corresponding driving transistor T1 to which the each of the sensing transistors T3 is coupled;
- in the two adjacent sub-pixel rows of the display substrate, when the first scanning signal written by the gate line corresponding to the preceding sub-pixel row is at an ineffective level and the first scanning signal written by the gate line corresponding to the subsequent sub-pixel row is at an effective level, turning on the driving transistors T1 and the sensing transistors T3 in the preceding sub-pixel row to charge the corresponding sending signal line SL to which each of the sensing transistors T3 is coupled;
- in the two adjacent sub-pixel rows of the display substrate, when the first scanning signal written by the gate line corresponding to the preceding sub-pixel row is at an ineffective level and the first scanning signal written by the gate line corresponding to the subsequent sub-pixel row is at an ineffective level, turning on the driving transistors T1 in the preceding sub-pixel row, turning off the sensing transistors T3 in the preceding sub-pixel row, the light-emitting units in the preceding sub-pixel row emitting light.

Specifically, in the P1 period, the first scanning signal written by the gate line corresponding to an N-th sub-pixel row is at an effective level, the first scanning signal written by the gate line corresponding to a (N+1)-th sub-pixel row is at an effective level, the data writing transistors T2 included in the N-th sub-pixel row are turned on, so that a data signal written by the corresponding data line to which each of the data writing transistors T2 is coupled, is transmitted to the gate electrode G1 of corresponding driving transistor T1 to which the each of the data writing transistors T2 is coupled. In the P1 period, each sensing signal line in the display substrate is written with a reset signal, and the sensing transistors T3 included in various sub-pixel driving circuits in the N-th sub-pixel row are turned on, so that the reset signal written by the corresponding sending signal line SL to which each of the sensing transistors T3 is coupled, is transmitted to the first electrode S1 of corresponding driving transistor T1 to which the each of the sensing transistors T3 is coupled.

In the P2 period, the first scanning signal written by the gate line corresponding to the N-th sub-pixel row is at an ineffective level, the first scanning signal written by the gate line corresponding to the (N+1)-th sub-pixel row is at an effective level, each sensing signal line SL in the display substrate stops writing the reset signal, and the driving transistors T1 and the sensing transistors T3 in the N-th sub-pixel row are turned on to charge the corresponding sending signal line SL to which each of the sensing transistors T3 is coupled.

In the P3 period, the first scanning signal written by the gate line corresponding to the N-th sub-pixel row is at the ineffective level, the first scanning signal written by the gate line corresponding to the (N+1)-th sub-pixel row is at the ineffective level, the driving transistors T1 in the N-th sub-pixel row are turned on, and the sensing transistors T3 in the N-th sub-pixel row are turned off, so that a driving signal generated by each driving transistor T1 in the N-th sub-pixel row flows to the corresponding light-emitting unit, thereby driving each light-emitting unit to emit light.

When the method provided in the embodiment of the present disclosure is used to drive the display substrate provided in the foregoing embodiment, one gate line can be used to simultaneously control on-off of the sensing transistors T3 included in the various sub-pixels in the same sub-pixel row, and on-off of the data writing transistors T2 included in the various sub-pixels in the adjacent next sub-pixel row, thereby reducing the number of signal lines and then improving the pixel aperture ratio while ensuring the normal display function of the display substrate.

Figure 14:
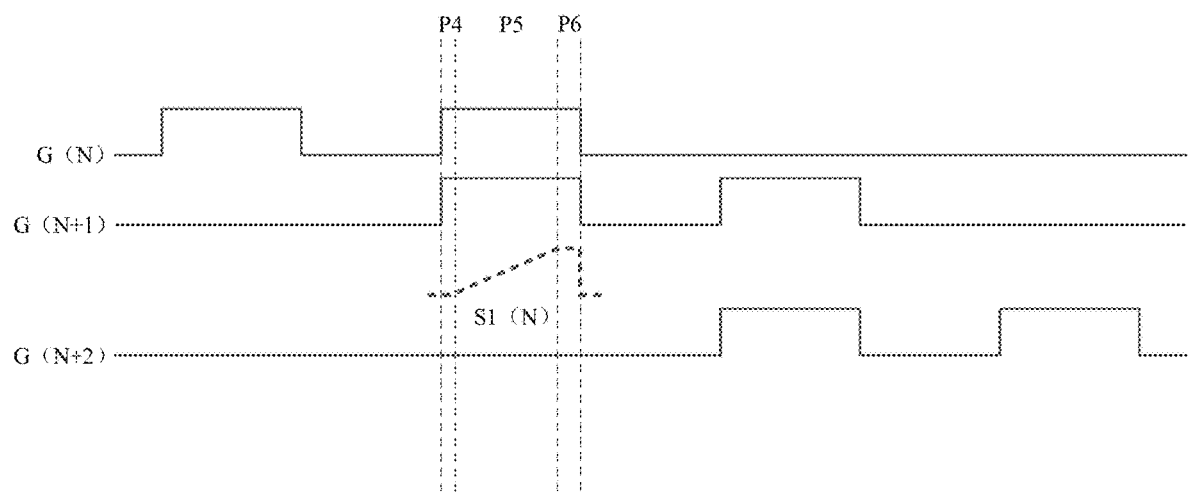
FIG. 14 is a schematic driving timing diagram of a gate of a display substrate during a shutdown period according to an embodiment of the present disclosure.

In some embodiments, in the power-off period, as shown in FIG. 14, along the extension direction of the data lines in the display substrate, a second scanning signal is written into the plurality of gate lines (such as G(N), G(N+1) and G(N+2)) one by one. The second scanning signal includes a first effective level period and a second effective level period arranged at intervals. For the adjacent gate lines, the second effective level period of the second scanning signal input from a preceding gate line coincides with the first effective level period of the second scanning signal input from the subsequent gate line (for example, P4, P5, P6 periods).

When the second scanning signal input from the preceding gate line is in the second effective level period, the data writing transistors T2 and the sensing transistors T3 included in the sub-pixel row corresponding to the preceding gate line are turned on.

In a first sub-period P4 of the second effective level period, the data writing transistor T2 transmits, an initialization signal written by the corresponding data line to which the data writing transistor T2 is coupled, to the gate electrode G1 of corresponding driving transistor T1 to which the data writing transistor T2 is coupled; the sensing transistor T3 transmits, the reset signal written by the corresponding sending signal line SL to which the sensing transistor T3 is coupled, to the first electrode S1 of corresponding driving transistor T1 to which the sensing transistors T3 is coupled.

In a second sub-period P5 of the second effective level period, the sensing signal line SL stops writing the initialization signal; the data writing transistor T2 continues transmitting, the initialization signal written by the corresponding data line to which the data writing transistor T2 is coupled, to the gate electrode G1 of corresponding driving transistor T1 to which the data writing transistor T2 is coupled, so that the driving transistor T1 is turned on to charge the corresponding sending signal line SL until a gate-source voltage Vgs of the driving transistor T1 is equal to a threshold voltage Vth of the driving transistor T1;

In a third sub-period P6 of the second effective level period, the sensing transistor T3 transmits, a voltage signal at the first electrode S1 of the driving transistor T1 to which the sensing transistor T3 is coupled, to the sensing signal line SL to which the sensing transistor T3 is coupled.

Specifically, in the first sub-period P4 of the second effective level period, the data line is written with the initialization signal, the sensing signal line SL is written with the reset signal. The data write transistor T2 can transmit, the initialization signal written by the corresponding data line to which the data writing transistor T2 is coupled, to the gate electrode G1 of corresponding driving transistor T1 to which the data writing transistor T2 is coupled. The sensing transistor T3 transmits, the reset signal written by the corresponding sending signal line SL to which the sensing transistor T3 is coupled, to the first electrode S1 of corresponding driving transistor T1 to which the sensing transistors T3 is coupled, thereby resetting the first electrode S1 of the driving transistor T1, which specifically refers to the voltage signal of the first electrode S1(N) of the driving transistor T1 of the N-th sub-pixel row in P4.

In the second sub-period P5 of the second effective level period, the sensing signal line SL stops writing the initialization signal, the data writing transistor T2 continues transmitting, the initialization signal written by the corresponding data line to which the data writing transistor T2 is coupled, to the gate electrode G1 of corresponding driving transistor T1 to which the data writing transistor T2 is coupled, so that the driving transistor T1 is turned on to charge the corresponding sending signal line SL, thereby enabling a potential of the first electrode S1(N) of the driving transistor T1 in the N-th sub-pixel row to be continuously increased, until a gate-source voltage Vgs of the driving transistor T1 is equal to a threshold voltage Vth of the driving transistor T1.

In the third sub-period P6 of the second effective level period, the data writing transistor T2 continues transmitting, the initialization signal written by the corresponding data line to which the data writing transistor T2 is coupled, to the gate electrode G1 of corresponding driving transistor T1 to which the data writing transistor T2 is coupled; the sensing transistor T3 transmits, a voltage signal at the first electrode S1 of the driving transistor T1 to which the sensing transistor T3 is coupled, to the sensing signal line SL to which the sensing transistor T3 is coupled, thereby collecting the voltage signal at the first electrode S1 of the driving transistor T1.

After the voltage signal at the first electrode S1 of the driving transistor T1 is collected in the third sub-period P6, the collected signal may be used to compensate the driving transistor in the display substrate, thereby making the image quality displayed by the display substrate more uniform.

When the method provided in the embodiment of the present disclosure is used to drive the display substrate provided in the foregoing embodiment, one gate line can be used to simultaneously control on-off of the sensing transistors T3 included in the various sub-pixels in the same sub-pixel row, and on-off of the data writing transistors T2 included in the various sub-pixels in the adjacent next sub-pixel row, thereby reducing the number of signal lines and then improving the pixel aperture ratio while realizing collection of the voltage signal at the first electrode S1 of each driving transistor T1 in the display substrate.

It should be noted that the embodiments in this specification are described in a progressive manner. The same or similar parts between the embodiments can be referred to each other. Each embodiment focuses on differences from other embodiments. In particular, for the method embodiments, since they are basically similar to the product embodiments and thus the description thereof is relatively simple, and the relevant parts can be referred to the description of the product embodiments.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Such words as "comprises" or "include" mean that an element or object appearing before the word covers elements or objects listed after the word and their equivalents, but do not exclude other elements or objects. Similarly, such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

It will be understood that when an element such as a layer, film, region, or substrate is referred to as being "on" or "under" another element, this element may be "directly" on or "under" the other element, or, there may be an intermediate element therebetween.

In the description of the above embodiments, specific features, structures, materials or characteristics may be combined in any suitable manner in any one or more embodiments or examples.

The above are merely the embodiments of the present disclosure and shall not be used to limit the scope of the present disclosure. It should be noted that, a person skilled in the art may make improvements and modifications without departing from the principle of the present disclosure, and these improvements and modifications shall also fall within the scope of the present disclosure. The protection scope of the present disclosure shall be subject to the protection scope of the claims.

What is claimed is:

1. A display substrate, comprising:
   a base substrate;
   a plurality of gate lines on the base substrate;
   a plurality of data lines on the base substrate; and
   a plurality of sub-pixels on the base substrate;
   wherein the plurality of gate lines and the plurality of data lines are arranged to cross each other;
   the plurality of sub-pixels include a plurality of sub-pixel columns that are corresponding to the plurality of data lines in a one-to-one manner; each of the plurality of sub-pixel columns includes a plurality of the sub-pixels arranged along an extension direction of the plurality of data lines;

the plurality of sub-pixels further include a plurality of sub-pixel rows that are corresponding to the plurality of gate lines in a one-to-one manner; each of the plurality of sub-pixel rows includes a plurality of the sub-pixels arranged along an extension direction of the plurality of gate lines;

each of the plurality of sub-pixels includes a sub-pixel driving circuit; the sub-pixel driving circuit includes a driving transistor, a data writing transistor and a sensing transistor; the driving transistor and the data writing transistor are located at a first side of an aperture area of the each of the plurality of sub-pixels; the sensing transistor is located at a second side of the aperture area of the each of the plurality of sub-pixels; the first side and the second side are opposite sides of the aperture area along the extension direction of the plurality of data lines;

a second electrode of the data writing transistor is coupled to a corresponding data line of the plurality of data lines; gate electrodes of sensing transistors in a same sub-pixel row of the plurality of sub-pixel rows, and gate electrodes of data writing transistors in an adjacent next sub-pixel row of the plurality of sub-pixel rows, are all coupled to a gate line of the plurality of gate lines corresponding to the adjacent next sub-pixel row;

the sub-pixel driving circuit further includes a storage capacitor coupled between a gate electrode of the driving transistor and a first electrode of the driving transistor; the storage capacitor includes a first electrode plate and a second electrode plate which are disposed oppositely; there is a first overlapping area between an orthographic projection of the first electrode plate to the base substrate and an orthographic projection of the second electrode plate to the base substrate; an orthographic projection of the first overlapping area to the base substrate at least partially overlaps an orthographic projection of the corresponding aperture area of the each of the plurality of sub-pixels.

2. The display substrate according to claim 1, wherein a first electrode of the data writing transistor is located at a third side of a gate line of the plurality of gate lines corresponding to the sub-pixel row where the data writing transistor is located; the second electrode of the data writing transistor is located at a fourth side of the gate line of the plurality of gate lines corresponding to the sub-pixel row where the data writing transistor is located; the third side and the fourth side are opposite along the extension direction of the plurality of data lines; an orthographic projection of a channel portion of the data writing transistor to the base substrate is located within an orthographic projection of the gate line of the plurality of gate lines corresponding to the sub-pixel row where the data writing transistor is located, to the base substrate;

a first electrode of the sensing transistor is located at a third side of a gate line of the plurality of gate lines corresponding to a next sub-pixel row adjacent the sensing transistor;

a second electrode of the sensing transistor is located at a fourth side of the gate line of the plurality of gate lines corresponding to the next sub-pixel row adjacent the sensing transistor; an orthographic projection of a channel portion of the sensing transistor to the base substrate is located with an orthographic projection of the gate line of the plurality of gate lines corresponding to the next sub-pixel row adjacent the sensing transistor to the base substrate;

each of the plurality of gate lines is simultaneously reused as the gate electrodes of various data writing transistors in the corresponding sub-pixel row, and the gate electrodes of the sensing transistors in a preceding sub-pixel row adjacent the corresponding sub-pixel row.

3. The display substrate according to claim 1, wherein the first electrode plate of the storage capacitor includes a first transparent electrode plate, and the second electrode plate of the storage capacitor includes a second transparent electrode plate;

the sub-pixel driving circuit further includes a first conductive connection portion;

a first end of the first conductive connection portion is coupled to the first electrode of the driving transistor; a second end of the first conductive connection portion is coupled to the second electrode of the sensing transistor;

the first conductive connection portion is reused as the second transparent electrode plate.

4. The display substrate according to claim 3, wherein the display substrate further includes a buffer layer disposed on a surface of the base substrate; the first transparent electrode plate of the storage capacitor is located between the buffer layer and the base substrate; the second transparent electrode plate of the storage capacitor is located on a surface of the buffer layer facing away from the base substrate.

5. The display substrate according to claim 4, wherein there is a fifth overlapping area between the orthographic projection of the first overlapping area to the base substrate and the orthographic projection of the corresponding aperture area of the each of the plurality of sub-pixels; an area of the fifth overlapping area is ¼ to ¾ of an area of the corresponding aperture area of the each of the plurality of sub-pixels.

6. The display substrate according to claim 3, wherein the first conductive connection portion, the first electrode of the driving transistor and the second electrode of the sensing transistor are arranged in a same layer, and are all made of transparent oxide conductive material.

7. The display substrate according to claim 3, wherein the sub-pixel driving circuit further includes a second conductive connection portion;

the second conductive connection portion is coupled to the first electrode of the data writing transistor, the first transparent electrode plate and the gate electrode of the driving transistor, respectively.

8. The display substrate according to claim 7, wherein there is a second overlapping area between an orthographic projection of the second conductive connection portion to the base substrate and an orthographic projection of the gate electrode of the driving transistor to the base substrate; the second conductive connection portion is coupled to the gate electrode of the driving transistor through a first via hole in the second overlapping area;

there is a third overlapping area between the orthographic projection of the second conductive connection portion to the base substrate and an orthographic projection of the first electrode of the data writing transistor to the base substrate; the second conductive connection portion is coupled to the first electrode of the data writing transistor through a second via hole in the third overlapping area;

there is a fourth overlapping area between the orthographic projection of the second conductive connection portion to the base substrate and an orthographic projection of the first transparent electrode plate to the base substrate; the second conductive connection portion is coupled to the first transparent electrode plate through a third via hole in the fourth overlapping area.

9. The display substrate according to claim 3, wherein the sub-pixel driving circuit further includes: a third conductive connection portion;
there is a sixth overlapping area between an orthographic projection of the third conductive connection portion to the base substrate and an orthographic projection of the first conductive connection portion to the base substrate; the third conductive connection portion is coupled to the first conductive connection portion through a fourth via hole in the sixth overlapping area;
each of the plurality of sub-pixels further includes a light-emitting unit disposed at one side of the sub-pixel driving circuit away from the base substrate; the light-emitting unit includes an anode, a light-emitting layer and a cathode, which are sequentially stacked in a direction away from the base substrate;
there is a seventh overlapping area between an orthographic projection of the anode to the base substrate and an orthographic projection of the third conductive connection portion to the base substrate; the anode is coupled to the third conductive connection portion through a fifth via hole in the seventh overlapping area.

10. The display substrate according to claim 9, wherein the orthographic projection of the anode to the base substrate overlaps an orthographic projection of the second transparent electrode plate of the storage capacitor to the base substrate.

11. The display substrate according to claim 1, wherein the display substrate further includes a light-shielding layer disposed on a surface of the base substrate; an orthographic projection of the light-shielding layer to the base substrate covers an orthographic projection of all driving transistors to the base substrate.

12. The display substrate according to claim 11, wherein the first electrode plate and the light-shielding layer are arranged in a same layer.

13. The display substrate according to claim 11, wherein there is an eighth overlapping area between the orthographic projection of the light-shielding layer to the base substrate and an orthographic projection of the first electrode of the driving transistor to the base substrate; the light-shielding layer is coupled to the first electrode of the driving transistor through a sixth via hole in the eighth overlapping area.

14. The display substrate according to claim 9, wherein the display substrate further includes:
color resist patterns corresponding to the plurality of sub-pixels in a one-to-one manner, wherein each of the color resist patterns is located between the corresponding sub-pixel driving circuit and the light-emitting unit, and an orthographic projection of each of the color resist patterns to the base substrate overlaps an orthographic projection of the aperture area of the corresponding sub-pixel to the base substrate;
a plurality of sensing signal lines and a plurality of power signal lines; wherein the plurality of sensing signal lines and the plurality of power signal lines all extend in the same direction as the extension direction of the plurality of data lines;
wherein between one of the plurality of power signal lines and one of the plurality of sensing signal lines adjacent the one of the plurality of power signal lines, there are two of the plurality of sub-pixel columns;
two of the plurality of data lines, which are corresponding to the two of the plurality of sub-pixel columns, are located between the two of the plurality of sub-pixel columns; the two of the plurality of sub-pixel columns are corresponding to the one of the plurality of power signal lines;
the plurality of sub-pixels define a plurality of pixel units; each of the plurality of pixel units includes at least three adjacent sub-pixels located in a same sub-pixel row, and colors of the color resist patterns corresponding to the at least three sub-pixels are different; the plurality of pixel units includes a plurality of pixel unit columns, each pixel unit column includes a plurality of the pixel units arranged along the extension direction of the plurality of data lines, and the plurality of pixel unit columns have a one-to-one correspondence with the plurality of sensing signal lines;
in the sub-pixel driving circuit included in each of the plurality of sub-pixels, the gate electrode of the driving transistor is coupled to the first electrode of the data writing transistor; the second electrode of the driving transistor is coupled to the corresponding power signal line; the second electrode of the sensing transistor is coupled to the corresponding sensing signal line.

15. The display substrate according to claim 14, wherein the display substrate further includes fourth conductive connection portions corresponding to the plurality of power signal lines in a one-to-one manner;
there is a ninth overlapping area between an orthographic projection of each of the fourth conductive connection portions to the base substrate and an orthographic projection of the corresponding power signal line to the base substrate; the fourth conductive connection portion is coupled to the corresponding power signal line through at least one seventh via hole in the ninth overlapping area.

16. The display substrate according to claim 15, wherein the fourth conductive connection portion and the gate electrode of the driving transistor are in the same layer and made of the same material.

17. The display substrate according to claim 14, wherein the color resist patterns corresponding to the at least three sub-pixels included in each of the plurality of pixel units include: a red color resist pattern, a white color resist pattern, a blue color resist pattern, and a green color resist pattern.

18. A display device, comprising: the display substrate according to claim 1.

19. A method for manufacturing a display substrate, comprising:
forming a plurality of gate lines, a plurality of data lines and a plurality of sub-pixels on a base substrate; wherein the plurality of gate lines and the plurality of data lines are arranged to cross each other;
wherein the plurality of sub-pixels include a plurality of sub-pixel columns that are corresponding to the plurality of data lines in a one-to-one manner, each of the plurality of sub-pixel columns includes a plurality of the sub-pixels arranged along an extension direction of the plurality of data lines;
the plurality of sub-pixels include a plurality of sub-pixel rows that are corresponding to the plurality of gate lines in a one-to-one manner, each of the plurality of sub-pixel rows includes a plurality of the sub-pixels arranged along an extension direction of the plurality of gate lines;

each of the plurality of sub-pixels includes a sub-pixel driving circuit; the sub-pixel driving circuit includes a driving transistor, a data writing transistor and a sensing transistor; the driving transistor and the data writing transistor are located at a first side of an aperture area of the each of the plurality of sub-pixels; the sensing transistor is located at a second side of the aperture area of the each of the plurality of sub-pixels; the first side and the second side are opposite sides of the aperture area along the extension direction of the plurality of data lines;

a second electrode of the data writing transistor is coupled to a corresponding data line of the plurality of data lines; a gate electrode of the sensing transistor, and gate electrodes of data writing transistors in a next sub-pixel row of the plurality of sub-pixel rows adjacent the sensing transistor, are all coupled to a gate line of the plurality of gate lines corresponding to the next sub-pixel row adjacent the sensing transistor;

the sub-pixel driving circuit further includes a storage capacitor coupled between a gate electrode of the driving transistor and a first electrode of the driving transistor; the storage capacitor includes a first electrode plate and a second electrode plate which are disposed oppositely; there is a first overlapping area between an orthographic projection of the first electrode plate to the base substrate and an orthographic projection of the second electrode plate to the base substrate; an orthographic projection of the first overlapping area to the base substrate at least partially overlaps an orthographic projection of the corresponding aperture area of the each of the plurality of sub-pixels.

20. A method for driving a display substrate, comprising:
a power-on period and a power-off period;
wherein the power-on period includes a plurality of display cycles; in each of the plurality of display cycles,
along an extension direction of data lines of the display substrate, writing first scanning signals into a plurality of gate lines of the display substrate one by one, wherein effective level periods of the first scanning signals input into adjacent gate lines partially overlap;

in two adjacent sub-pixel rows of the display substrate, when the first scanning signal written by the gate line corresponding to a preceding sub-pixel row is at an effective level and the first scanning signal written by the gate line corresponding to a subsequent sub-pixel row is at the effective level, turning on data writing transistors included in various sub-pixel driving circuits in the preceding sub-pixel row, to transmit a data signal written by the corresponding data line to which each of the data writing transistors is coupled, to a gate electrode of a corresponding driving transistor to which the each of the data writing transistors is coupled; meanwhile, turning on sensing transistors included in various sub-pixel driving circuits in the preceding sub-pixel row, to transmit a reset signal written by the corresponding sending signal line to which each of the sensing transistors is coupled, to a first electrode of corresponding driving transistor to which the each of the sensing transistors is coupled;

in the two adjacent sub-pixel rows of the display substrate, when the first scanning signal written by the gate line corresponding to the preceding sub-pixel row is at an ineffective level and the first scanning signal written by the gate line corresponding to the subsequent sub-pixel row is at the effective level, turning on the driving transistors and the sensing transistors in the preceding sub-pixel row to charge the corresponding sending signal line to which each of the sensing transistors is coupled;

in the two adjacent sub-pixel rows of the display substrate, when the first scanning signal written by the gate line corresponding to the preceding sub-pixel row is at the ineffective level and the first scanning signal written by the gate line corresponding to the subsequent sub-pixel row is at the ineffective level, turning on the driving transistors in the preceding sub-pixel row, turning off the sensing transistors in the preceding sub-pixel row, light-emitting units in the preceding sub-pixel row emitting light.

* * * * *